(12) United States Patent
Aoyagi et al.

(10) Patent No.: US 10,355,180 B2
(45) Date of Patent: Jul. 16, 2019

(54) LIGHT EMITTING DEVICE AND LIGHT EMITTING MODULE

(71) Applicant: Panasonic Intellectual Property Management Co., Ltd., Osaka (JP)

(72) Inventors: Tooru Aoyagi, Kyoto (JP); Shigeo Hayashi, Kagoshima (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/874,422

(22) Filed: Jan. 18, 2018

(65) Prior Publication Data
US 2018/0204989 A1 Jul. 19, 2018

Related U.S. Application Data

(63) Continuation of application No. PCT/JP2016/003374, filed on Jul. 19, 2016.
(Continued)

(51) Int. Cl.
*H01L 33/54* (2010.01)
*H01L 33/48* (2010.01)
(Continued)

(52) U.S. Cl.
CPC .......... *H01L 33/54* (2013.01); *H01L 33/483* (2013.01); *H01L 33/56* (2013.01); *H01L 33/62* (2013.01);
(Continued)

(58) Field of Classification Search
CPC ............ H01L 33/60; H01L 2933/0041; H01L 33/56; A61L 2209/12; A61L 2/10
(Continued)

(56) References Cited

U.S. PATENT DOCUMENTS

2011/0309388 A1* 12/2011 Ito .................. H01L 33/507
257/89
2012/0025218 A1* 2/2012 Ito .................. H01L 33/502
257/98
(Continued)

FOREIGN PATENT DOCUMENTS

| JP | 2010-219324 A | 9/2010 |
| JP | 2012-004303 A | 1/2012 |
| JP | 6065135 B2 | 1/2017 |

OTHER PUBLICATIONS

International Search Report issued in Application No. PCT/JP2016/003374 dated Oct. 18, 2016, with English translation.

*Primary Examiner* — Jonathan Han
(74) *Attorney, Agent, or Firm* — McDermott Will & Emery LLP

(57) ABSTRACT

A light emitting device including: a light emitting element including a growth substrate and a semiconductor layer located below the growth substrate; a light transmissive member disposed above a top surface of the light emitting element; and a transparent resin bonding the top surface and a bottom surface of the light transmissive member, wherein the bottom surface encompasses the top surface, the transparent resin continuously covers the bottom surface and a side surface of the semiconductor layer. The transparent resin is disposed to cover a covered portion located at a central portion of the semiconductor layer and to expose an exposed portion located at a side edge portion of the semiconductor layer in a direction parallel to the top surface in a side view, and covers the side surface of the semiconductor layer so that at least 20% in length of the semiconductor layer in the direction is covered.

14 Claims, 15 Drawing Sheets

Related U.S. Application Data

(60) Provisional application No. 62/195,758, filed on Jul. 22, 2015.

(51) Int. Cl.
   *H01L 33/62* (2010.01)
   *H01L 33/56* (2010.01)
   *H01L 33/60* (2010.01)
   *H01L 33/50* (2010.01)
   *H01L 33/32* (2010.01)

(52) U.S. Cl.
   CPC .......... *H01L 33/32* (2013.01); *H01L 33/502* (2013.01); *H01L 33/505* (2013.01); *H01L 33/60* (2013.01); *H01L 2933/005* (2013.01); *H01L 2933/0033* (2013.01); *H01L 2933/0058* (2013.01); *H01L 2933/0066* (2013.01)

(58) Field of Classification Search
   USPC ............... 257/98, 88, E33.061, E33.072, 99, 257/E27.121, E33.057, E33.06, E33.064, 257/E33.067, 13, 89; 438/27, 26, 29, 69
   See application file for complete search history.

(56) References Cited

U.S. PATENT DOCUMENTS

| | | | | |
|---|---|---|---|---|
| 2014/0054621 | A1* | 2/2014 | Seko | H01L 33/505 257/88 |
| 2014/0252388 | A1* | 9/2014 | Kimura | H01L 33/502 257/98 |
| 2015/0207045 | A1* | 7/2015 | Wada | H01L 33/505 257/88 |
| 2016/0064611 | A1* | 3/2016 | Choi | H01L 33/382 257/98 |
| 2016/0293810 | A1 | 10/2016 | Baike et al. | |

* cited by examiner

-0.325 (mm)   0.000 (mm)   0.325 (mm)   0.650 (mm)

LIGHT EMITTING DEVICE AND LIGHT EMITTING MODULE

CROSS REFERENCE TO RELATED APPLICATIONS

This application is a U.S. continuation application of PCT International Patent Application Number PCT/JP2016/003374 filed on Jul. 19, 2016, claiming the benefit of priority of U.S. Provisional Application No. 62/195,758 filed on Jul. 22, 2015, the entire contents of which are hereby incorporated by reference.

BACKGROUND

1. Technical Field

The present disclosure relates to a light emitting device and a light emitting module.

2. Description of the Related Art

In recent years, semiconductor light emitting elements such as light emitting diodes (LEDs) and laser diodes (LDs) have been utilized as light sources. Light emitting devices utilizing semiconductor light emitting elements include one in which a wavelength conversion layer that includes phosphor is formed on the top surface of a light emitting element, and the side surfaces of the light emitting element and the wavelength conversion layer are covered by a reflective member. For example, see Japanese Unexamined Patent Application Publication No. 2012-4303 (patent literature (PLT)1).

The light emitting device disclosed in PLT 1 includes; a substrate; a plurality of light emitting elements mounted on the substrate; a transparent material layer disposed on the light emitting elements; a plate-like optical layer mounted on the transparent material layer; and a reflection material layer disposed around the plurality of light emitting elements. In the light emitting device disclosed in PLT 1, the bottom surface of the plate-like optical layer covers the top surfaces of the plurality of light emitting elements, and the reflective material layer forms an inclined side surface that connects the lower end of the outer side surface of each of the plurality of light emitting elements and the side surface of the plate-like optical layer.

With this structure, the light emitting device reflects light emitted from the side surface of each light emitting element at an inclined surface of the reflective material layer, without such light coming back inside the light emitting element. As such, the light emitting device disclosed in PLT 1 provides a high light extraction efficiency, which is a ratio of the amount of light extracted to the outside of the light emitting device relative to the amount of the light emitted from the light emitting element.

SUMMARY

However, the light emitting device disclosed in PLT 1 fails to extract light emitted from the light emitting element sufficiently to the outside of the light emitting device. In view of this problem, the present disclosure aims to provide a light emitting device and a light emitting module that improve the light extraction efficiency.

The light emitting device according to one aspect of the present disclosure is a light emitting device that includes: a light emitting element including a growth substrate and a semiconductor layer located below the growth substrate; a light transmissive member disposed above a top surface of the light emitting element; and a transparent resin bonding the top surface of the light emitting element and a bottom surface of the light transmissive member. In the light emitting device, the bottom surface of the light transmissive member encompasses the top surface of the light emitting element. The transparent resin continuously covers the bottom surface of the light transmissive member and a side surface of the semiconductor layer. The transparent resin is disposed to cover a covered portion of the semiconductor layer and to expose an exposed portion of the semiconductor layer, the covered portion and the exposed portion being located at a central portion and a side edge portion, respectively, in a direction parallel to the top surface of the light emitting element in a side view. The transparent resin covers the covered portion so that the side surface of the semiconductor layer is covered by at least 20% in length of the semiconductor layer in the direction.

In other words, in a side view of the light emitting device, the transparent resin is disposed on a side surface of the light emitting element such that a periphery of the transparent resin passes across between a region with a high light emission intensity located at the central portion of the semiconductor layer and a region with a low light emission intensity located at a side edge of the semiconductor layer.

Accordingly, a part of light emitted from a region with a high light emission intensity is guided to the outside of the light emitting device in a shorter distance than in the case where the side surface of the light emitting element is fully covered by the transparent resin. In other words, a part of light emitted from the light emitting element travels a shorter distance to pass through the transparent resin than in the case where the side surface of the light emitting element is fully covered by the transparent resin. This reduces the loss in light attributable to the transparent resin, and thus achieves an improved light extraction efficiency of the light emitting device.

The light emitting device and the light emitting module according to the present disclosure improve the light extraction efficiency.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 4E is a cross-sectional view of the light emitting device taken at a broken line IVE-IVE in. FIG. 3;

DETAILED DESCRIPTION OF THE EMBODIMENTS

Figure 1:
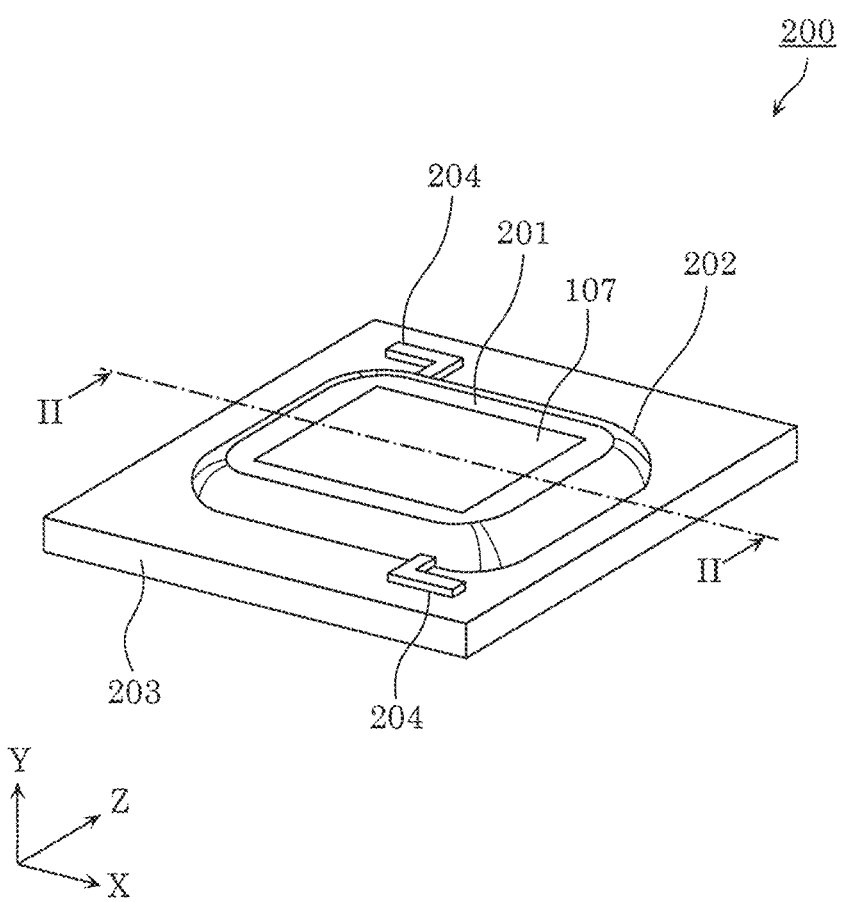
FIG. 1 is a perspective view showing the light emitting module including the light emitting device according to embodiments.

The following describes in detail the embodiments according to the present disclosure with reference to the drawings. Note that the following embodiments show an exemplary illustration of the present disclosure. The numerical values, shapes, materials, structural components, the arrangement and connection of the structural components, steps, the processing order of the steps etc. shown in the following embodiments are mere examples, and therefore are not intended to limit the present disclosure. The scope of the present disclosure is limited only by the language recited in Claims. Therefore, of the structural components described in the following embodiments, structural components not recited in any one of the independent claims that indicate the broadest concepts of the present disclosure will be described.

Note that the drawings are schematic diagrams, and thus they are not necessarily precise illustrations. Also note that descriptions of components that are substantially the same as those previously described may be omitted. In the present Specification, the Y axis in the drawings indicates a direction in which each layer of the light emitting element is stacked. The X axis and the Z axis in the drawings indicate directions orthogonal to the Y axis. The X axis is in a direction orthogonal to the Z axis. In the present Specification, the positive direction in the Y axis is defined as an upward direction.

Also in the present Specification, the terms "upper/upward" and "bottom/downward" do not indicate an up direction (vertically upward direction) and a down direction (vertically downward direction), respectively, in the absolute meaning of spatial recognition. The terms "upper/upward" and "bottom/downward" may be used to describe the case where two structural components are disposed in intimate contact with each other, in addition to describing the case where two structural components are disposed spaced apart from each other and another structural component is disposed in between such two structural components.

Also note that in the present Specification, "parallel" means "approximately parallel" and thus there may be some manufacturing tolerances. Likewise, in the present Specification, "orthogonal" means "approximately orthogonal" and thus there may be sonic manufacturing tolerances.

(EMBODIMENT)

[1. Basic Structure of Light Emitting Device and Light Emitting Module]

Figure 2:
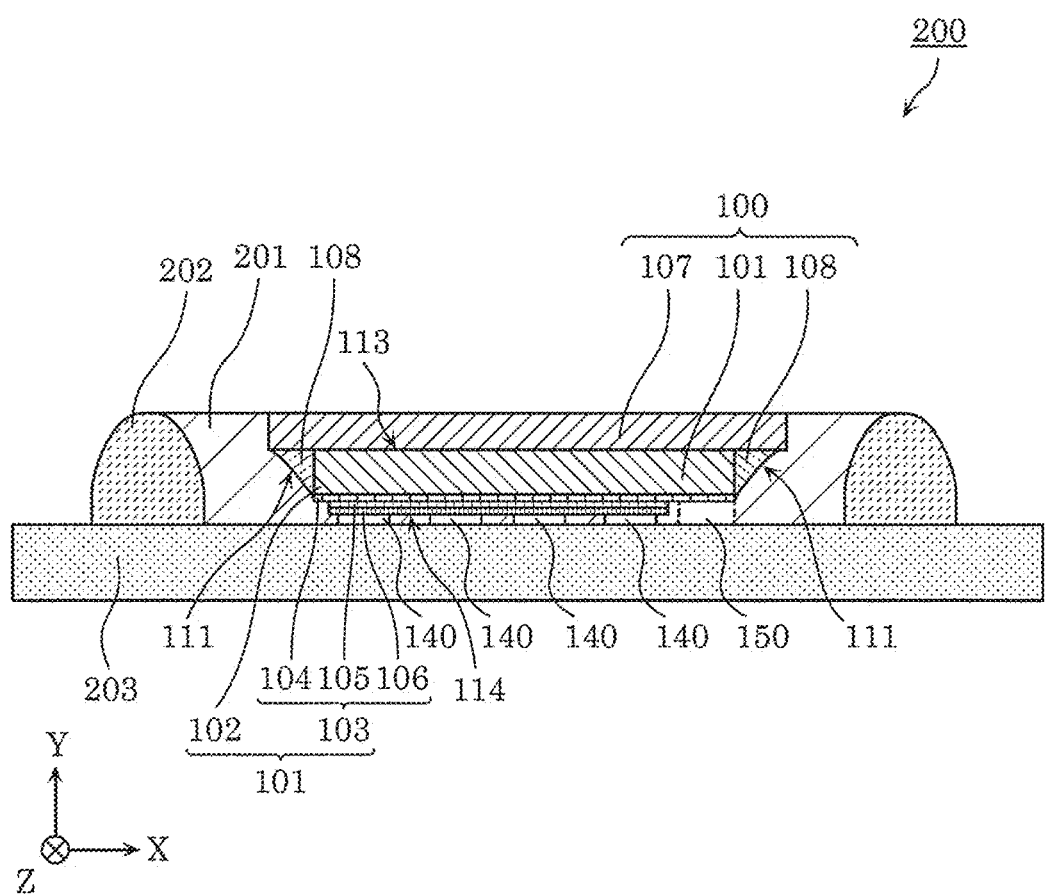
FIG. 2 is a cross-sectional view of the light emitting module taken at a broken line II-II in FIG. 1.

With reference to FIG. 1 and FIG. 2, the following describes a light emitting device and a light emitting module including such light emitting device according to the present embodiments. FIG. 1 is a perspective view showing the light emitting module including the light emitting device according to the present embodiments. FIG. 2 is a cross-sectional view of the light emitting module taken at a broken line II-II in FIG. 1.

As illustrated in FIG. 1 and FIG. 2, light emitting module 200 includes mounting substrate 203, light emitting element 101, light transmissive member 107, transparent resin 108, reflective resin 201, and dam material 202.

Mounting substrate 203 is a substrate that includes a wiring region in which wirings 204 are provided. Wiring 204 is a metal wiring for supplying power to light emitting element 101. Non-limiting examples of a material of mounting substrate 203 include metal, ceramic, and resin. Example materials of a ceramic substrate include aluminum oxide and aluminum nitride. Example materials of a metal substrate include aluminum alloy, iron alloy, and copper alloy, each including an insulation film on a surface thereof. Example materials of a resin substrate include glass epoxy.

Light emitting element 101 is a semiconductor light emitting element having an approximately cuboid shape and including growth substrate 102 and semiconductor layer 103 that is formed on growth substrate 102. Semiconductor layer 103 includes n-type semiconductor layer (1-type semiconductor layer) 104, active layer (light emitting layer) 105, and p-type semiconductor layer (2-type semiconductor layer) 106. More specifically, n-type semiconductor layer 104, active layer 105, and p-type semiconductor layer 106 are formed on growth substrate 102 in this order. N-electrodes (not illustrated) and n-electrode bumps 150 are provided on n-type semiconductor layer 104. P-electrodes (not illustrated) and p-electrode bumps 140 are provided on p-type semiconductor layer 106. As such, p-type semiconductor layer 106 and active layer 105 are unformed in portions on which n-electrode bumps 150 are formed. N-electrode bumps 150 are disposed at two portions: at one corner of light emitting element 101 at semiconductor layer 103 side; and at the opposing corner in a top view.

Light generated in active layer 105 of light emitting element 101 is emitted toward light transmissive member 107 via growth substrate 102. Stated differently, the surface of light emitting element 101 at semiconductor layer 103 side, on which n-electrode bumps 150 and p-electrode bumps 140 are formed, serves as mounting surface (the bottom surface of light emitting element 101) 114 to be mounted onto mounting substrate 203. Meanwhile, the other surface of light emitting element 101 at growth substrate 102 side serves as light emitting surface (the top surface of light emitting element 101) 113 from which light from light emitting element 101 is emitted. In other words, light emitting element 101 is flip-chip mounted (or flip-chip bonded) onto mounting substrate 203. Stated differently, light emitting module 200 according to the present embodiments is a light emitting module onto which light emitting element 101 is flip-chip mounted.

Note that although light emitting element 101 emits light not only from light emitting surface (the top surface of light emitting element 101) 113 but also from its side surfaces and mounting surface (the bottom surface of light emitting element 101) 114, the present Specification defines the top surface of light emitting element 101 as light emitting surface 113.

Any material with translucency may be used as the material of growth substrate 102. Non-limiting examples of the material of growth substrate 102 include insulating sapphire, gallium nitride (GaN), silicon carbide (SiC), aluminum gallium nitride (AlGaN), and aluminum nitride (AlN). Note that from the standpoint of light emission efficiency, a GaN substrate may be used as the material of growth substrate 102.

Light transmissive member 107 is a plate-shaped member including a wavelength conversion member that converts the wavelength of a part of light emitted from light emitting element 101. Nonlimiting examples of the material of the wavelength conversion member include the following known wavelength conversion materials: YAG ($Y_3Al_5O_{12}$) phosphor; CASN ($CaAlSiN_3$) phosphor; and SiAlON phosphor. Light transmissive member 107 is formed by dispersing the wavelength conversion material in a material such as resin, ceramic, and glass.

Light transmissive member 107 is bonded to growth substrate 102, which is located above light emitting surface 113 of light emitting element 101, via transparent resin 108. Stated differently, the surface of light transmissive member 107 at light emitting element 101 side serves as a bonding surface (the bottom surface of the light transmissive member) 110 to be bonded to light emitting element 101 via transparent resin 108, while the opposing surface serves as a surface from which light from light emitting device 100 and light emitting module 200 is emitted.

Transparent resin 108 is an adhesive that bonds light emitting element 101 and light transmissive member 107. Transparent resin 108 also serves as a light guiding member that guides light emitted from the side surfaces of light emitting element 101 toward light transmissive member 107 (upward). Transparent resin 108 covers bonding surface 110 of light transmissive member 107 and the side surfaces of light emitting element 101. As illustrated in FIG. 2, the sides of transparent resin 108 opposite to light emitting element 101 continuously cover the side surfaces of light emitting element 101 in such a manner that the sides of transparent resin 108 incline relative to the respective side surfaces of light emitting element 101. Stated differently, light emitting device 100 according to the present embodiments includes inclined surfaces 111 formed of transparent resin 108 that are inclined relative to the respective side surfaces of light emitting element 101 in a side view.

A method of manufacturing light emitting device 100 is as follows: first, a predetermined amount of transparent resin 108 is applied to light emitting surface 113 of light emitting element 101 through a dispenser; next, light transmissive member 107 is placed on transparent resin 108 and then pressed from above so that transparent resin 108 covers the entirety of light emitting surface 113 of light emitting element 101. As a result, transparent resin 108 extends off bonding surface 110 of light transmissive member 107 to cover the side surfaces of light emitting element 101. Because of surface tension, the sides of transparent resin. 108 opposite to light emitting element 101, in a side view of the light emitting element, are formed to incline relative to the respective side surfaces of light emitting element 101. A detailed description is given later about the method of manufacturing light emitting device 100 and light emitting module 200 according to the present embodiments.

Note that any material that is transparent to light emitted from light emitting element 101 may be used as the material of transparent resin 108. For example, a silicone resin with high light transmissivity to light emitted from light emitting element 101 may be used as transparent resin 108. The wavelength of light emitted from light emitting element 101 is, for example, a wavelength of light within the near-ultraviolet range and the visible range.

Reflective resin 201 is, for example, a silicone resin added with a material such as oxidized titanium particle having light reflectivity. Reflective resin 201 is disposed to cover the side surfaces of light emitting element 101, transparent resin 108, and light transmissive member 107. Light emitted from the side surfaces of light emitting element 101 is reflected at the interface between transparent resin 108 and reflective resin 201 to be guided toward light transmissive member 107.

Dam material 202 is provided on mounting substrate 203 to surround light emitting element 101 in order to dam reflective resin 201 in the manufacturing process of the light emitting device. A thermosetting resin or a thermoplastic resin having insulating properties, for example, is used as dam material 202. More specific examples of dam material 202 include silicone resin, phenol resin, epoxy resin, bis-maleimide triazine resin, and polyphthalamide (PPA) resin. Note that dam material 202 may be a material other than resin, and thus may be, for example, ceramic.

[2-1. Shape of Transparent Resin]

[2-1-1. Embodiment 1]

Figure 3:
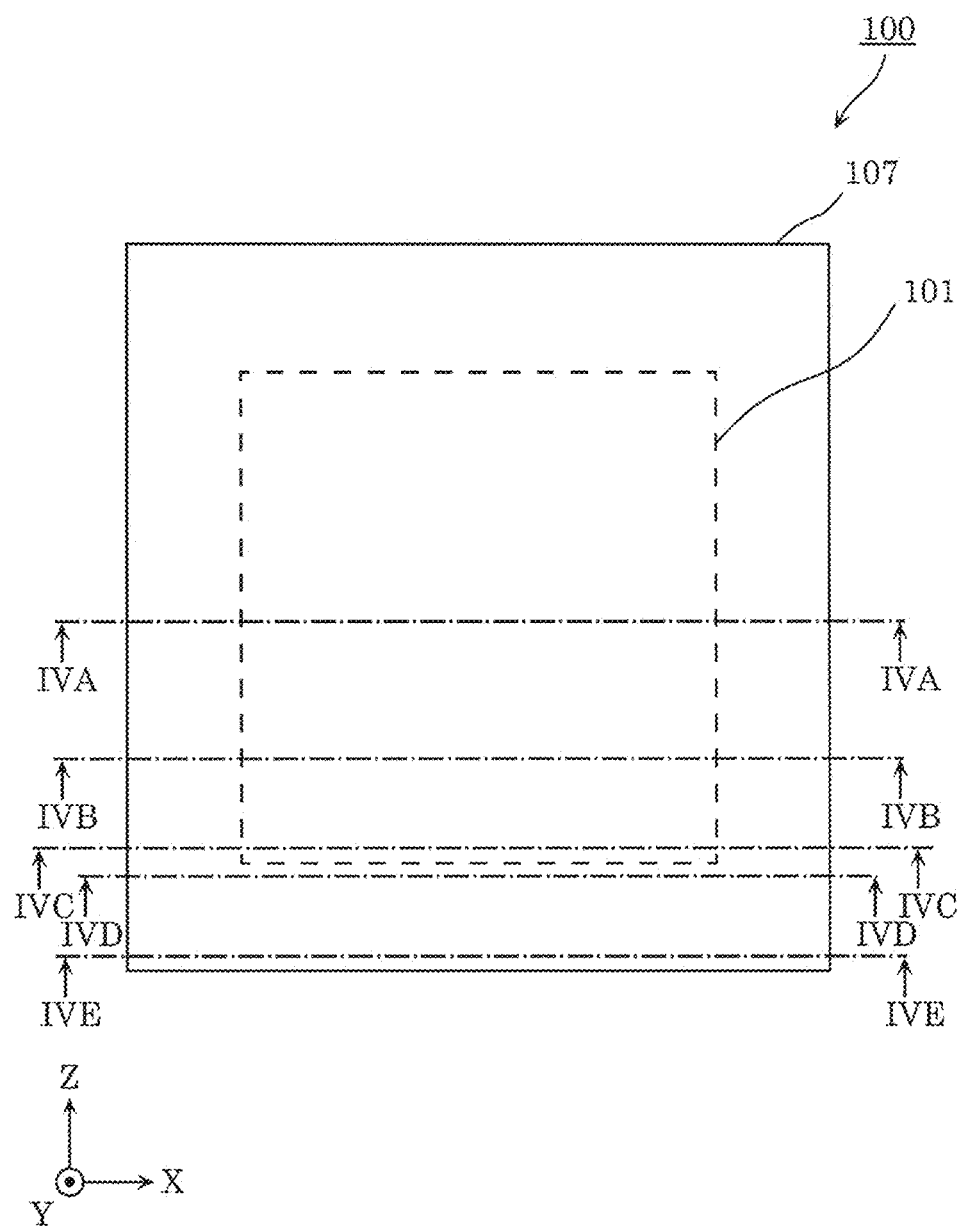
FIG. 3 is a top view of the light emitting device according to the embodiments.
Figure 4A:
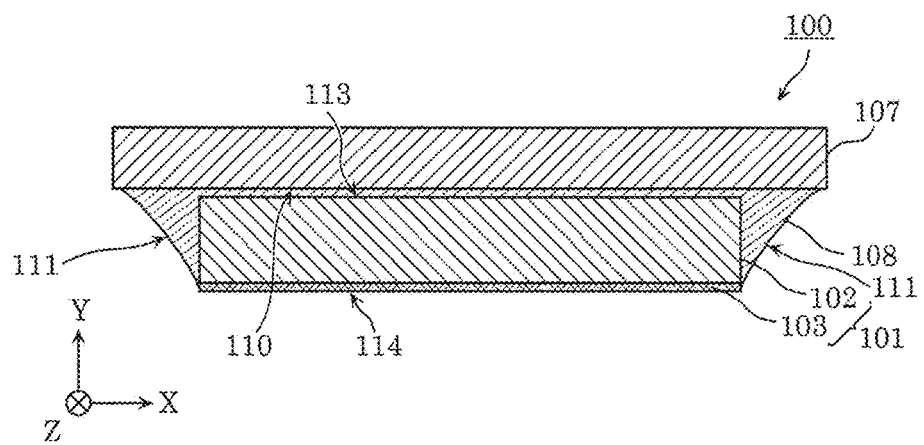
FIG. 4A is a cross-sectional view of the light emitting device taken at a broken line IVA-IVA in FIG. 3.
Figure 4B:
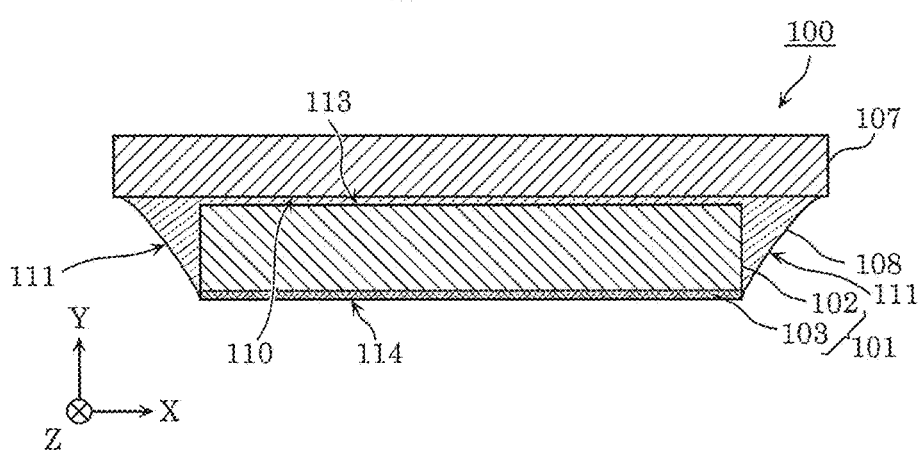
FIG. 4B is a cross-sectional view of the light emitting device taken at a broken line IVB-IVB in FIG. 3.
Figure 4C:
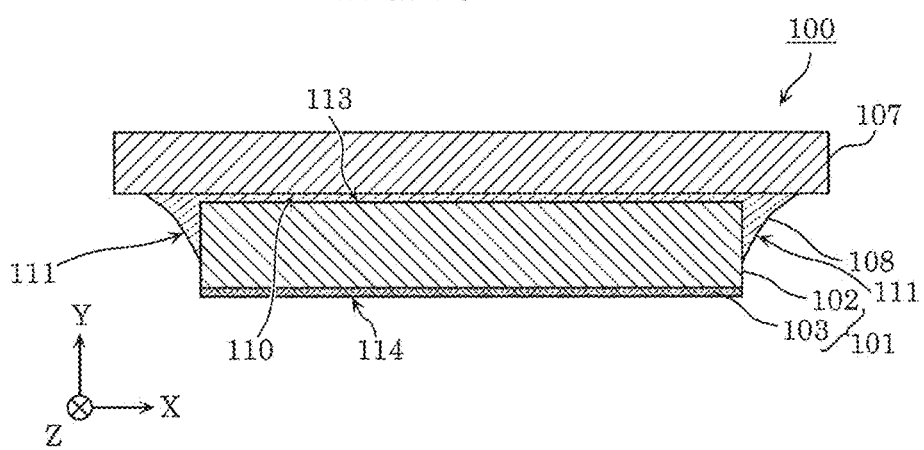
FIG. 4C is a cross-sectional view of the light emitting device taken at a broken line IVC-IVC in FIG. 3.
Figure 4D:
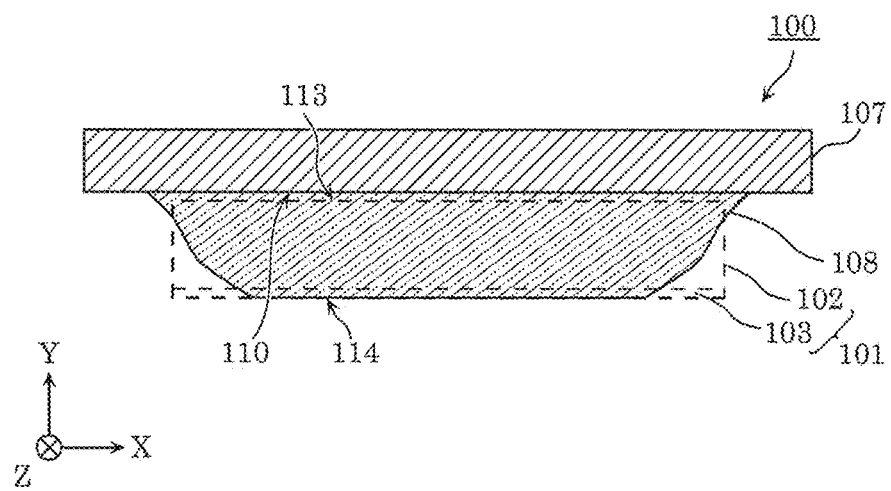
FIG. 4D is a cross-sectional view of the light emitting device taken at a broken line IVD-IVD in FIG. 3.
Figure 4E:
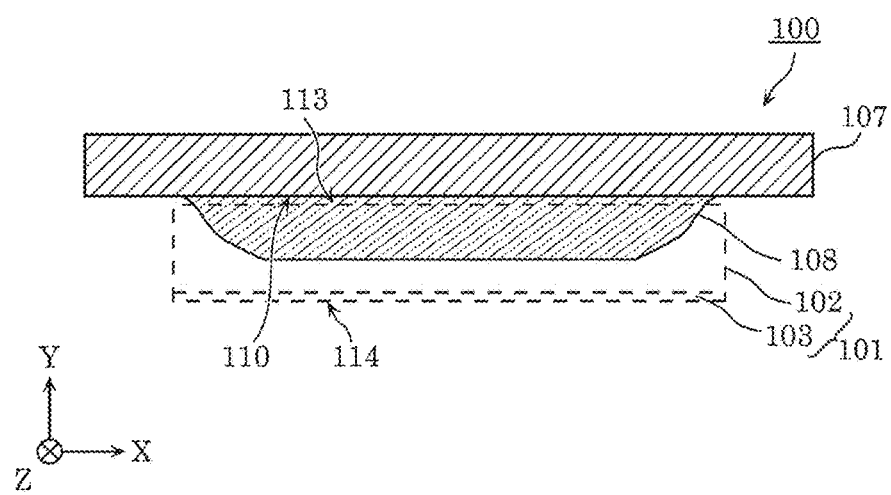

With reference to FIG. 3 to FIG. 4E, the following describes a cross-sectional shape of transparent resin 108 of light emitting device 100 according to Embodiment 1. FIG. 3 is a top view showing the disposition of light transmissive member 107 and light emitting element 101. FIG. 4A to FIG. 4E are cross-sectional views showing a relationship among light emitting element 101, light transmissive member 107, and transparent resin 108. Note that FIG. 3 to FIG. 4E omit the illustration of mounting substrate 203, n-electrode bumps 150, p-electrode bumps 140, reflective resin 201, and dam material 202.

As illustrated in FIG. 3, in a top view, light transmissive member 107 and light emitting element 101 are disposed such that the center of the plane of light transmissive member 107 and the center of the plane of light emitting element 101 overlap each other. Also, light transmissive member 107 and light emitting element 101 each have an approximately square shape in a top view, and are disposed such that their respective sides are parallel to each other.

FIG. 4A is a cross-sectional view taken at a broken line IVA-IVA, shown in FIG. 3, that is positioned approximately at the half-way point of the length of light emitting element 101 in the Z direction (i.e., a cross-section taken at a line passing through an approximately midpoint of light emitting element 101 in a top view). As illustrated in FIG. 4A, transparent resin 108 is disposed so as to cover bonding surface 110 of light transmissive member 107 through to the lower end of the side surfaces of light emitting element 101. Moreover, the sides of transparent resin 108 opposite to light emitting element 101 are formed to incline relative to the respective side surfaces of light emitting element 101. Stated differently, in a side view of light emitting element 101, transparent resin 108 forms inclined surfaces 111 that are inclined relative to the respective side surfaces of light emitting element 101.

FIG. 4B is a cross-sectional view taken at a broken line IVB-IVB, shown in FIG. 3, that is positioned at approximately one quarter the length of light emitting element 101 in the Z direction. As illustrated in FIG. 4B, transparent resin 108 is disposed to connect the lower end of the side surfaces of light emitting element 1.01 and bonding surface 110 of light transmissive member 107. Stated differently, transparent resin 108 is disposed so as to cover bonding surface 110 of light transmissive member 107 through to the lower end of the side surfaces of light emitting element 101 in such a manner that transparent resin 108 covers the side surfaces of light emitting element 101. Moreover, the sides of transparent resin 108 opposite to light emitting element 101 are formed to incline relative to the respective side surfaces of light emitting element 101. Stated differently, in a side view of light emitting element 101, transparent resin 108 forms inclined surfaces 111 that are inclined relative to the respective side surfaces of light emitting element 101.

FIG. 4C is a cross-sectional view taken at a broken line IVC-IVC, shown in FIG. 3, that passes through the vicinity of a side surface of light emitting element 101. As illustrated in FIG. 4C, transparent resin 108 is disposed so as to connect the side edge portions (the side edge portions of semiconductor layer 103 or growth substrate 102) of light emitting element 101 and bonding surface 110 of light transmissive member 107. Stated differently, transparent resin 108 does not fully cover bonding surface 110 of light transmissive member 107 through to the lower end of the side surfaces of light emitting element 101. In other words, transparent resin 108 is disposed to continuously cover bonding surface 110 of light transmissive member 107 through to a midpoint of each of the side surfaces of light emitting element 101 in the negative direction of the Y axis. Moreover, the sides of transparent resin 108 opposite to light emitting element 101 are formed to incline relative to the respective side surfaces of light emitting element 101. Stated differently, in a side view of light emitting element 101, transparent resin 108 forms inclined surfaces 111 that are inclined relative to the respective side surfaces of light emitting element 101.

FIG. 4D is a cross-sectional view taken at a broken line IVD-IVD, shown in FIG. 3, that passes through just outside of a side surface of light emitting element 101. As illustrated in FIG. 4D, the external appearance of transparent resin 108 in a side view is in an approximately trapezoidal shape whose upper side facing light transmissive member 107 is longer. The upper side of transparent resin 108 in an approximately trapezoidal shape is located at bonding surface 110 of light transmissive member 107, and is shorter than the length of bonding surface 110 of light transmissive member 107 in the X direction. Moreover, the upper side of transparent resin 108 in an approximately trapezoidal shape is longer than the length of light emitting surface 113 of light emitting element 101 in the X direction. Meanwhile, the bottom side of transparent resin 108 in an approximately trapezoidal shape is located approximately at the lower end of the side surfaces of light emitting element 101. The bottom side of transparent resin 108 in an approximately trapezoidal shape in the external appearance is shorter than the length of mounting surface 114 of light emitting element 101 in the X direction. Stated differently, transparent resin 108 is disposed so as not to cover the corner portions at mounting surface 11.4 side of light emitting element 101.

FIG. 4E is a cross-sectional view taken at a broken line IVE-IVE, shown in FIG. 3, that passes along the vicinity of one edge portion of light transmissive member 107. As illustrated in FIG. 4E, the external appearance of transparent resin 108 is in an approximately trapezoidal shape whose upper side facing light transmissive member 107 is longer. The upper side of transparent resin 108 in an approximately trapezoidal shape is located at bonding surface 110 of light transmissive member 107, and is about the same length as the length of light emitting surface 113 of light emitting element 101 in the X direction. Meanwhile, the bottom side of transparent resin 108 in an approximately trapezoidal shape is located closer to light emitting surface 113 of light emitting element 101 than to mounting surface (bottom surface) 114 of light emitting element 101. Moreover, the bottom side of transparent resin 108 in an approximately trapezoidal shape is shorter than the length of mounting surface 114 of light emitting element 101 in the X direction; about two-thirds the length of mounting surface 114 of light emitting element 101 in the X direction.

Note that inclined surfaces 111 of transparent resin 108 connecting the lower end of light emitting element 101 through to bonding surface 110 of light transmissive member 107 may be of any shape so long as inclined surfaces 111 are inclined relative to the respective side surfaces of light emitting element 101. Inclined surfaces 111 formed of transparent resin 108 may be flat surfaces, convex curved surfaces, or concave curved surfaces. Here, "inclined relative to the respective side surfaces" means that inclined surfaces 111, which serve as the interface between transparent resin 108 and reflective resin 201 that are vertically located with respect to the respective side surfaces of light emitting element 101, are inclined relative to such side surfaces.

Figure 7:
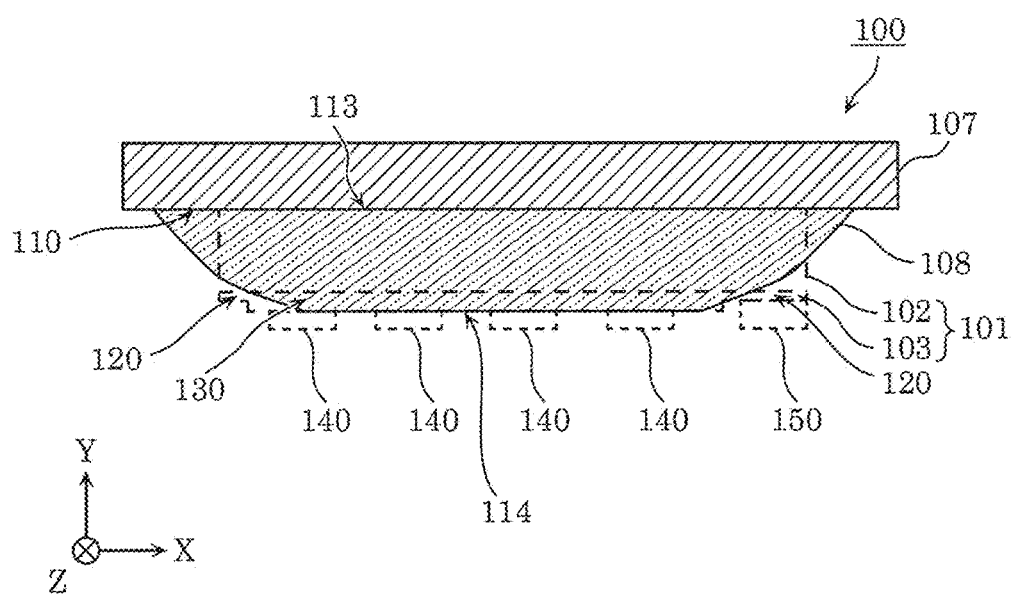
FIG. 7 is a cross-sectional view of the light emitting device taken at a broken line in FIG. 6.

In FIG. 4A to FIG. 4E, light emitting surface 113 of light emitting element 101 and bonding surface 110 of light transmissive member 107 are illustrated to be spaced apart from each other via transparent resin 108. As described above, in the manufacturing method of light emitting device 100, first, a predetermined amount of transparent resin 108 is applied to light emitting surface 113 of light emitting element 101 through a dispenser, and then light transmissive member 107 is placed on transparent resin 108 to be pressed from above so that transparent resin 108 covers the entirety of light emitting surface 113 of light emitting element 101. In so doing, light transmissive member 107 may be pressed so that light emitting surface 113 of light emitting element 101 and bonding surface 110 of light transmissive member 107 are in contact with each other. In FIG. 2 and FIG. 7 according to the present embodiment, light emitting surface 113 of light emitting element 101 and bonding surface 110 of light transmissive member 107 in light emitting device 100 and light emitting device 100a are illustrated to be in contact with each other.

Figure 5:
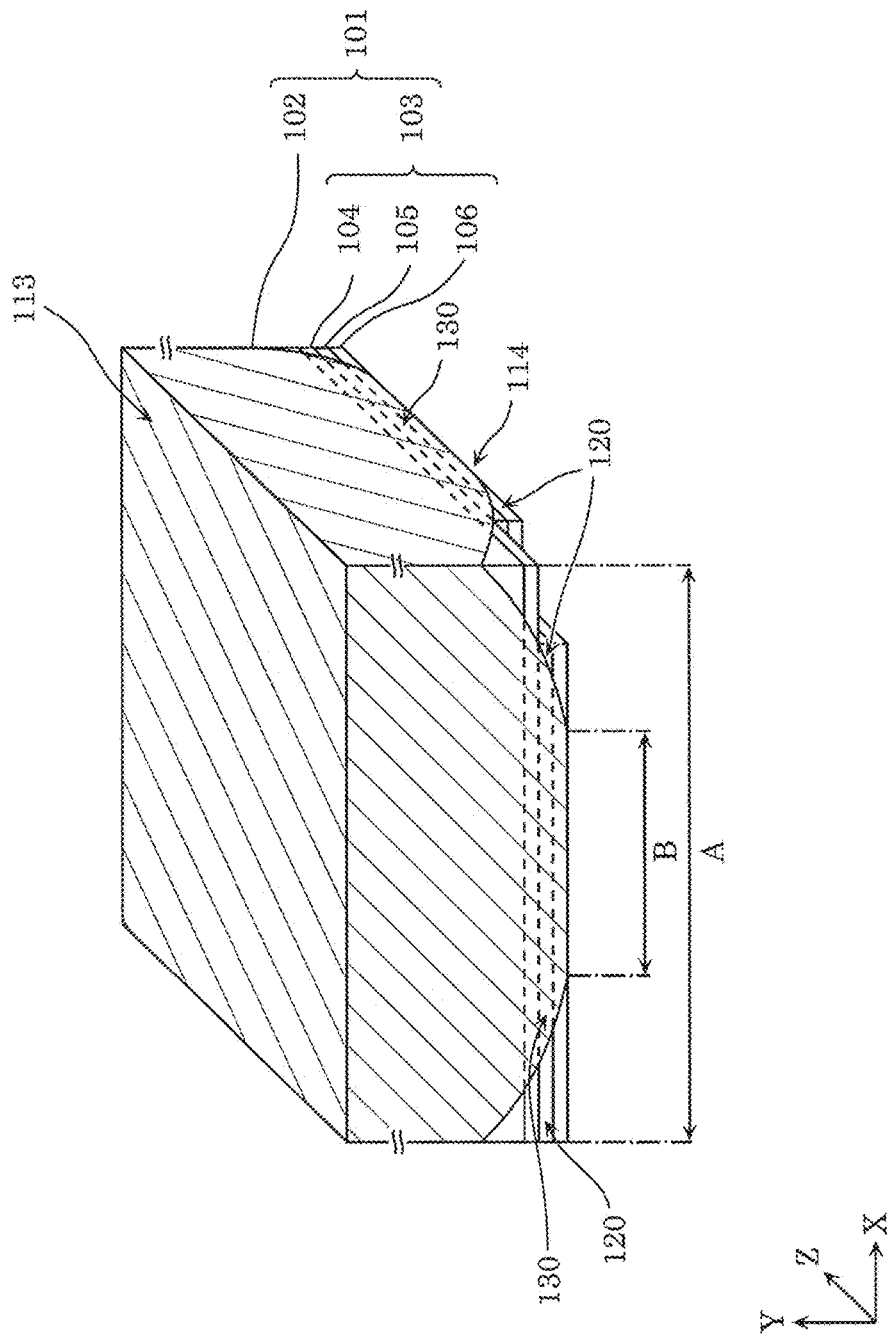
FIG. 5 is a schematic perspective view showing sides of the light emitting element according to Embodiment 1 that are covered by the transparent resin.

Next, with reference to FIG. 5, a description is given of covered portions that are covered by transparent resin 108 and exposed portions that are not covered by transparent resin 108 on the side surfaces of light emitting element 101 according to Embodiment 1. Note that transparent resin 108 is not illustrated in FIG. 5, but the diagonally shaded area in light emitting element 101 in FIG. 5 indicates a region covered by transparent resin 108.

As illustrated in FIG. 5, light emitting element 101 includes growth substrate 102 disposed at its upper side and semiconductor layer 103, including active layer 105, disposed at its bottom side. Moreover, light emitting element 101 includes, on its side surfaces, covered portions 130 covered by transparent resin 108 (not illustrated). Transparent resin 108 continuously covers all four side surfaces of light emitting element 101 from their top to their lower ends. Meanwhile, light emitting element 101 includes, at its corner portions at semiconductor layer 103 side (mounting surface 114 side), exposed portions 120 that are not covered by transparent resin 108. In other words, four corner portions at mounting surface 114 side of light emitting element 101, which is approximately cuboid, are not covered by transparent resin 108 and thus are exposed. Stated differently, transparent resin 108 covers the side surfaces of light emitting element 101 such that covered portions 130 and exposed portions 120 described above are formed on all four side surfaces of light emitting element 101.

On one of the side surfaces of light emitting element 101, transparent resin 108 fully covers predetermined range B at the lower end of such one side surface. Meanwhile, in regions other than predetermined range B (exposed portions 120), reflective resin 201 directly covers p-type semiconductor layer (2-type semiconductor layer) 106, active layer (light emitting layer) 105, and n-type semiconductor layer (1-type semiconductor layer) 104. Stated differently, in a side view of light emitting element 101, transparent resin 108 does not cover the regions outside of the peripheries of transparent resin. 108 connecting the lower end and the respective side edges of growth substrate 102 of light emitting element 101 (i.e., corner portions at mounting surface 114 side of light emitting element 101). A detailed description of a range in light emitting element 101 covered by transparent resin 108 will be given later.

Figure 6:
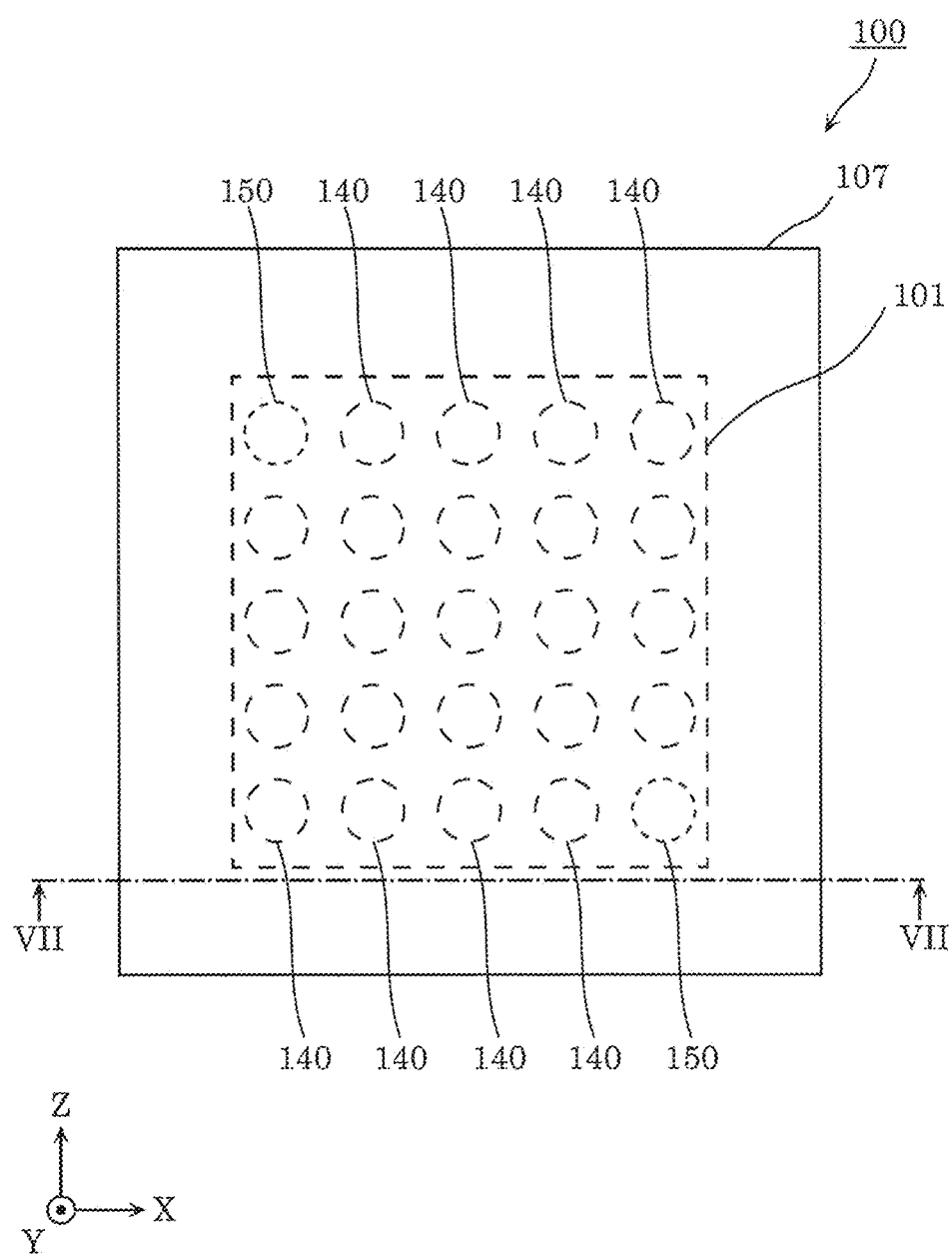
FIG. 6 is a top view of the light emitting device according to Embodiment 1.
Figure 8:
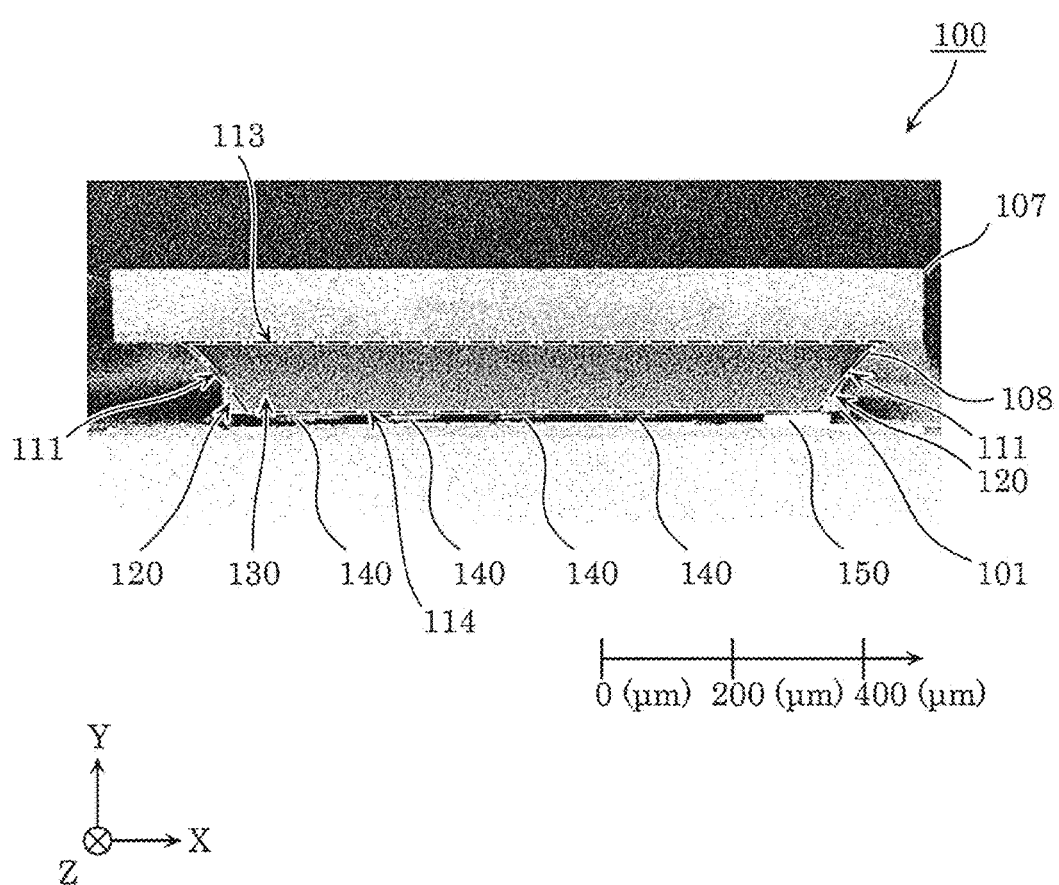
FIG. 8 is a SEM image of a side surface of the light emitting device according to Embodiment 1.

Next, with reference to FIG. 6 to FIG. 8, a description is given of the disposition of the electrodes in light emitting element 101 and a region in light emitting element 101 covered by transparent resin 108 according to Embodiment 1. FIG. 6 is a top view of light emitting device 100 according to Embodiment 1. FIG. 7 is a cross-sectional view of light emitting device 100 taken at a broken line in FIG. 6. FIG. 8 is a scanning electron microscope (SEM) image of light emitting device 100 according to Embodiment 1 in a side view. Note that in FIG. 8, the inner area enclosed by a broken line indicates a region where transparent resin 108 is disposed.

As illustrated in FIG. 6, in a top view, light transmissive member 107 and light emitting element 101 are disposed such that the center of the plane of light transmissive member 107 and the center of the plane of light emitting element 101 overlap each other. Also, light transmissive member 107 and light emitting element 101 each have an approximately square shape in a top view, and are disposed such that their respective sides are parallel to each other. Light emitting element 101 includes, on its mounting surface 114, two n-electrode bumps 150 and twenty-three p-electrode bumps 140.

Of the two n-electrode bumps 150, one n-electrode bump 150 is formed at one corner of mounting surface 114 of light emitting element 101, and the other n-electrode bump 150 is formed at the opposing corner in a top view. As illustrated in FIG. 6, p-electrode bumps 140 are arranged in array on mounting surface 114 of light emitting element 101 in the X and Z directions.

As illustrated in FIG. 7, semiconductor layer 103 are not covered by transparent resin 108 and thus are exposed at those two corner portions of light emitting element 101 at mounting surface 114 side where n-electrode bumps 150 are formed and at two corner portions where n-electrode bump 150 is unformed. Moreover, in a side view of light emitting element 101, the peripheries of transparent resin 108 are disposed to so as to connect the lower end of covered portion 130 and the side edges of growth substrate 102. Further, the peripheries of transparent resin 108 are disposed to extend from the respective side edges of growth substrate 102 to the bottom surface of light transmissive member 107 in such a manner that the peripheries of transparent resin 108 incline relative to the respective side surfaces of light emitting element 101. Stated differently, the sides of transparent resin 108 opposite to light emitting element 101 form inclined surfaces 111 that are inclined relative to the respective side surfaces of light emitting element 101. Accordingly, lights emitted from the side surfaces of light emitting element 101 are reflected at inclined surfaces 111 to be emitted from the upper portion of light emitting device 100. In other words, this structure allows for extracting sufficient light emitted from light emitting element 101, and thus improves the light extraction efficiency of light emitting device 100.

Since active layer 105 is unformed on portions in light emitting element 101 near n-electrode bumps 150, such portions do not emit light. As such, although such portions are not covered by transparent resin 108 but directly by reflective resin 201, their effect on the light extraction efficiency is insignificant compared to the effects attributable to other portions. Note that in FIG. 7, at mounting surface 114 side of light emitting element 101, the right-hand side bump contacting mounting substrate 203 is n-electrode bump 150, and the other four bumps are p-electrode bumps 140.

FIG. 8 is a SEM image of light emitting device 100 according to Embodiment 1 in a side view. The SEM image shown in FIG. 8 is an image of light emitting device 100 before reflective resin 201 is disposed. Semiconductor layer 103 includes regions not covered by transparent resin 108 at the bottom right-hand corner of light emitting element 101, which is in the vicinity of n-electrode bump 150, and at the bottom left-hand corner of light emitting element 101, at which n-electrode bump 150 is unformed. In other words, in a side view of light emitting element 101, transparent resin 108 is disposed such that transparent resin 108 passes diagonally across semiconductor layer 103 from the lower end of semiconductor layer 103 at mounting surface 114 side of light emitting element 101 toward the respective side edges of growth substrate 102.

The shape of transparent resin 108 in a side view of light emitting device 100 can be identified through a digital scope. An image identified by a digital scope is an optic microscopic image, and thus the peripheries of transparent resin 108 located at the lower part of the side surface of light emitting element 101 thinly covered by transparent resin 108 are identified as lines that define the boundary. Such boundary-defining lines serve as the boundary between the presence and absence of transparent resin. 108 (the peripheries of transparent resin 108).

Note that in Embodiment 1 described above, the shape of transparent resin 108 viewed from one side surface has been described. However, light emitting element 101 is approximately cuboid having four side surfaces. This means that the above description of Embodiment 1 is applicable to any of the four side surfaces in a side view. Stated differently, in a direction parallel to the top surface of light emitting element 101 in a side view (e.g., the X direction in FIG. 8), transparent resin 108 forms covered portion 130 located at the central portion where semiconductor layer 103 is covered and exposed portions 120 located at the edges where semiconductor layer 103 is not covered.

[2-1-2. Embodiment 2]

Figure 9:
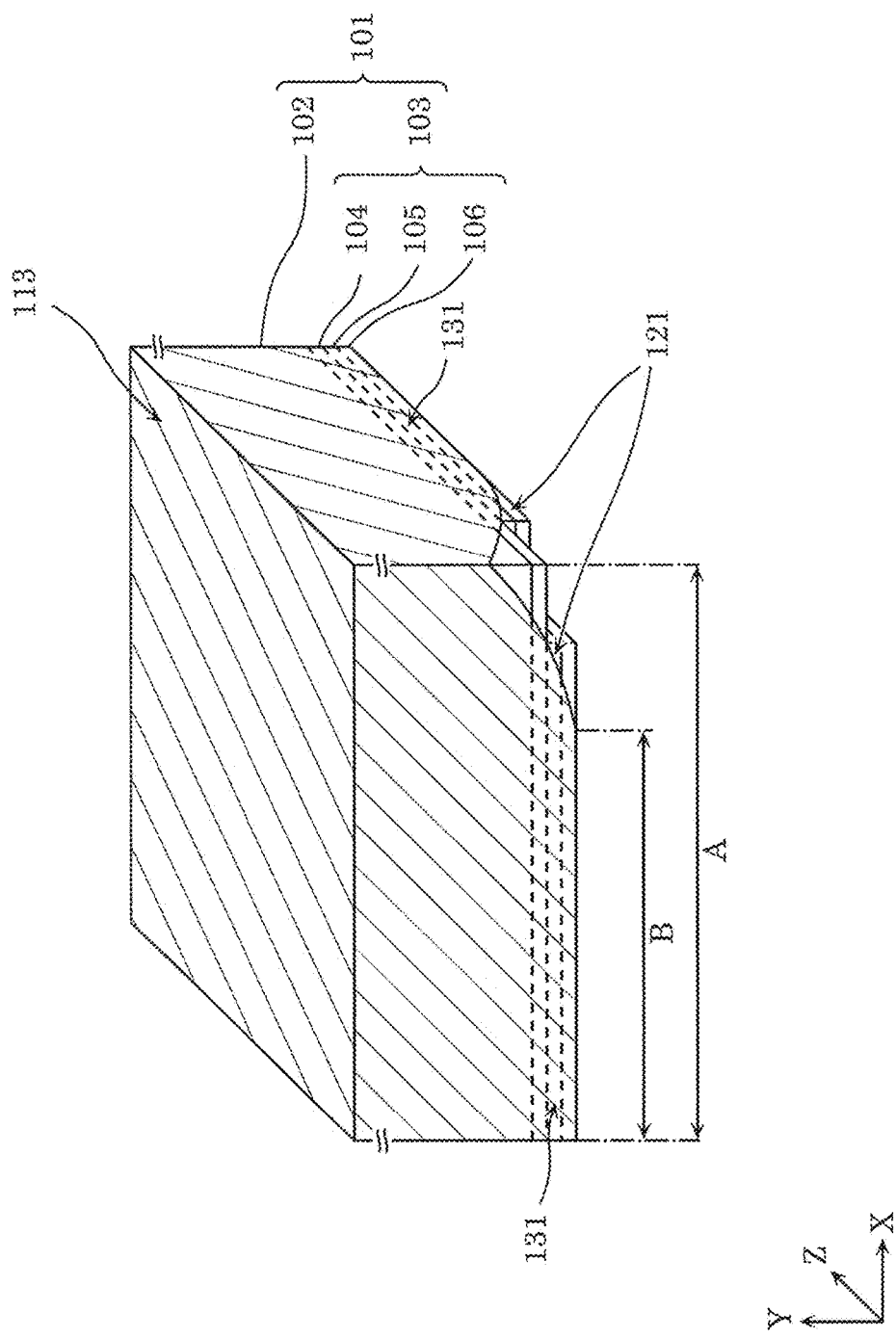
FIG. 9 is a schematic perspective view showing sides of the light emitting element according to Embodiment 2 that are covered by the transparent resin.

Next, with reference to FIG. 9, a description is given of a covered portion covered by transparent resin 108 in light emitting element 101 according to Embodiment 2. Note that transparent resin 108 is not illustrated in FIG. 9, but the diagonally shaded area in light emitting element 101 in FIG. 9 indicates a region covered by transparent resin 108.

As illustrated in FIG. 9, light emitting element 101 includes growth substrate 102 disposed at its upper side and semiconductor layer 103, including active layer 105, disposed at its bottom side. Moreover, light emitting element 101 includes, on its side surfaces, covered portions 131 covered by transparent resin 108 for bonding light transmissive member 107.

As illustrated in FIG. 9, transparent resin 108 according to Embodiment 2 continuously covers the side surfaces of light emitting element 101 from their top to their lower ends, as in the case of transparent resin 108 according to Embodiment 1. Meanwhile, in a side view of light emitting element 101, light emitting element 101 includes, at its corner portions at mounting surface 114 side, exposed portions 121 that are not covered. In other words, corner portions at mounting surface 114 side of light emitting element 101, which is approximately cuboid, are not covered by transparent resin 108 and thus are exposed. Note that transparent resin 108 covers the side surfaces of light emitting element 101 such that covered portions 131 and exposed portions 121 described above are formed on all four side surfaces of light emitting element 101.

Different from light emitting element 101 according to Embodiment 1, light emitting element 101 according to Embodiment 2 includes, at its mounting surface 114 side, both an exposed corner portion that is not covered by transparent resin 108 and thus is exposed, and an unexposed corner portion that is covered by transparent resin 108.

On one of the side surfaces of light emitting element 101, transparent resin 108 fully covers predetermined range B at the lower end of light emitting element 101. Meanwhile, in the region other than predetermined range B (exposed portion 121), reflective resin 201 directly covers p-type semiconductor layer 106, active layer 105, and n-type semiconductor layer 104. Stated differently, in a side view of light emitting element 101, transparent resin 108 does not cover the region outside of the periphery of transparent resin 108 connecting the lower end and the side edge of growth substrate 102 of light emitting element 101 (i.e., the corner portion at mounting surface 114 side of light emitting element 101). A detailed description of a range in light emitting element 101 covered by transparent resin 108 will be given later.

Figure 10:
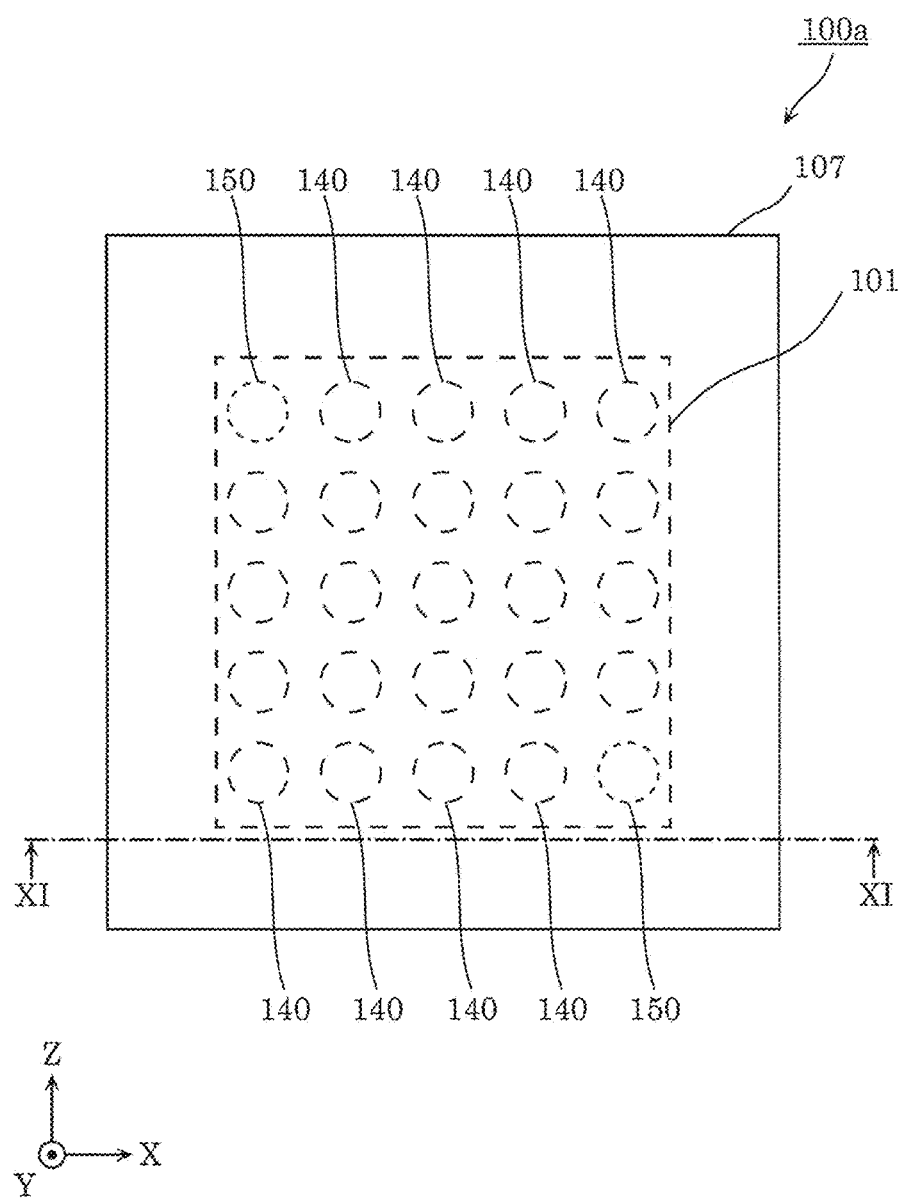
FIG. 10 is a top view of the light emitting device according to Embodiment 2.
Figure 11:
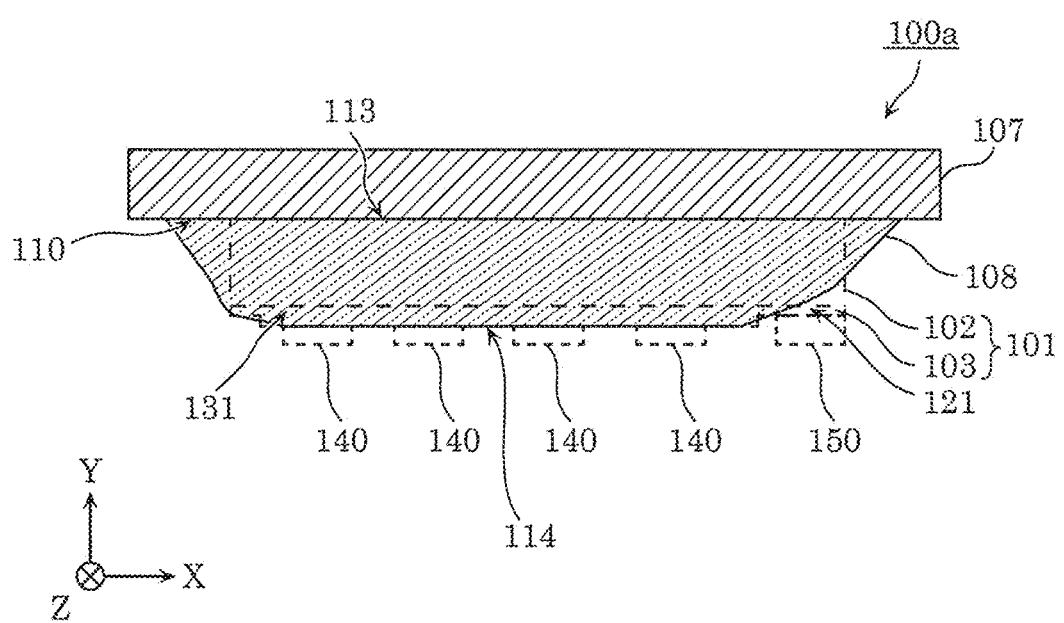
FIG. 11 is a cross-sectional view of the tight emitting device taken at a broken line XI-XI in FIG. 10.
Figure 12:
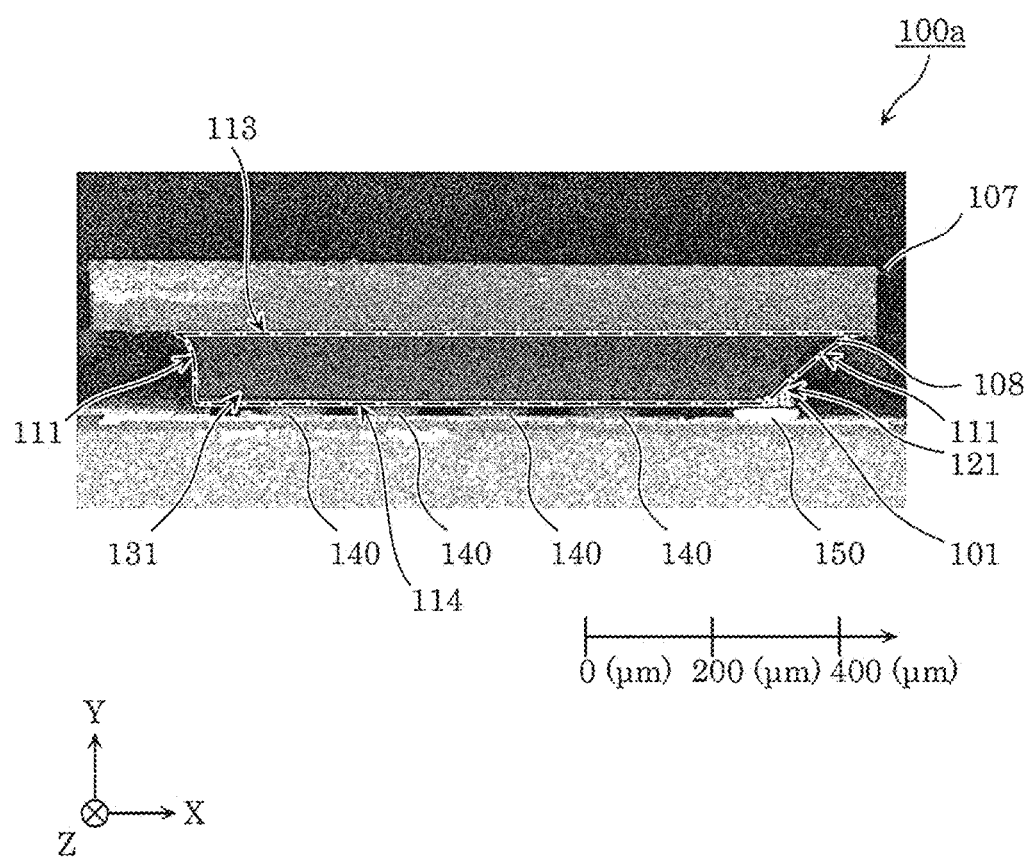
FIG. 12 is a SEM image of a side surface of the light emitting device according to Embodiment 2.

Next, with reference to FIG. 10 to FIG. 12, a description is given of the disposition of the electrodes in light emitting element 101 and a region in light emitting element 101 covered by transparent resin 108 according to Embodiment 2. FIG. 10 is a top view of light emitting device 100a according to Embodiment 2. FIG. 11 is a cross-sectional view of light emitting device 100a taken at a broken line XI-XI in FIG. 10. FIG. 12 is a SEM image of light emitting device 100a according to Embodiment 2 in a side view. Note that in FIG. 12, the inner area enclosed by a broken line indicates a region where transparent resin 108 is disposed.

As illustrated in FIG. 10, in a top view, light transmissive member 107 and light emitting element 101 are disposed such that the center of the plane of light transmissive member 107 and the center of the plane of light emitting element 101 overlap each other. Also, light transmissive member 107 and light emitting element 101 each have an approximately square shape in a top view, and are disposed such that their respective sides are parallel to each other. Light emitting element 101 includes, on its mounting surface 114, two n-electrode bumps 150 and twenty-three p-electrode bumps 140.

Of the two n-electrode bumps 150, one n-electrode bump 150 is formed at one corner of mounting surface 114 of light emitting element 101, and the other n-electrode bump 150 is formed at the opposing corner in a top view. As illustrated in FIG. 10, p-electrode bumps 140 are arranged in array on mounting surface 114 of light emitting element 101 in the X and Z directions.

As illustrated in FIG. 11, different from light emitting device 100 according to Embodiment 1, in light emitting device 100a according to Embodiment 2, only those corner portions of semiconductor layer 103 which are located at mounting surface 114 side of light emitting element 101 and at which n-electrode bumps 150 are formed, are not covered by transparent resin 108 and thus are exposed. In Embodiment 2, the other corner portions, at which n-electrode bump 150 is unformed, are fully covered by transparent resin 108. Moreover, in a side view of light emitting element 101, the peripheries of transparent resin 108 are disposed so as to connect the lower end of covered portion 131 and the respective side edges of growth substrate 102. Furthermore, the peripheries of transparent resin 108 are disposed to extend from the respective side edges of growth substrate 102 to the bottom surface of light transmissive member 107 in such a manner that the peripheries of transparent resin 108 incline relative to the respective side surfaces of light emitting element 101. Stated differently, the sides of transparent resin 108 opposite to light emitting element 101 form inclined surfaces 111 that are inclined relative to the respective side surfaces of light emitting element 101, Accordingly, lights emitted from the side surfaces of light emitting element 101 are reflected at inclined surfaces 111 to be emitted from the upper portion of light emitting device 100a. In other words, this structure allows for extracting sufficient light emitted from light emitting element 101, and thus improves the light extraction efficiency of light emitting device 100a.

Since active layer 105 is unformed on portions in light emitting element 101 near n-electrode bumps 150, such portions do not emit light. As such, although such portions are not covered by transparent resin 108 but directly by reflective resin 201, their effect on the light extraction efficiency is insignificant compared to the effects attributable to other portions. Note that in FIG. 11, at mounting surface 114 side of light emitting element 101, the right-hand side bump contacting mounting substrate 203 is n-electrode bump 150, and the other four bumps are p-electrode bumps 140.

FIG. 12 is a SEM image of light emitting device 100a according to Embodiment 2 in a side view. The SEM image shown in FIG. 12 is an image of light emitting device 100a before reflective resin. 201 is disposed. A region in semiconductor layer 103 not covered by transparent resin 108 exists only at a corner portion at the bottom right-hand corner of light emitting element 101 illustrated in FIG. 12 where n-electrode bump 150 is disposed. In other words, in a side view of light emitting element 101., transparent resin 108 is disposed only in the vicinity of the corner portion at which n-electrode bump 150 is disposed, such that the periphery of transparent resin 108 passes diagonally across semiconductor layer 103 from the lower end of semiconductor layer 103 toward the side edge of growth substrate 102. Stated differently, only the corner portion of light emitting element 101 at which n-electrode bump 150 is disposed is exposed portion 121 riot covered, by transparent resin 108.

Note that in. FIG. 12, the bump on mounting surface 114 of light emitting element 101 that is illustrated at the right-hand side of the drawing and that contacts mounting substrate 203 is n-electrode bump 150, and the other four bumps are p-electrode bumps 140.

Note that in Embodiment 2 described above, the shape of transparent resin 108 viewed from one side surface has been described. However, light emitting element 101 is approximately cuboid having four side surfaces. This means that the above description of Embodiment 2 is applicable to any of the four side surfaces in a side view, except for the positions of exposed portions 121. Stated differently, in a direction parallel to light emitting surface 113 of light emitting element 101 in a side view, semiconductor layer 103 includes covered portion 131 that is covered by transparent resin 108 and exposed portion 121 that is not covered by transparent resin 108 and that is located at one of the edge sides.

In Embodiment 2, two n-electrode bumps 150 are formed on mounting surface 114 of light emitting element 101. Of the two n-electrode bumps 150, one n-electrode bump 150 is formed at one corner of mounting surface 114 of light emitting element 101, and the other n-electrode bump 150 is formed at the opposing corner in a top view. Two corner portions located at mounting surface 114 side of light emitting element 101 where n-electrode bumps 150 are formed are not covered by transparent resin 108 and thus are exposed,

[3. Length of Lower End of Transparent Resin]

Figure 13:
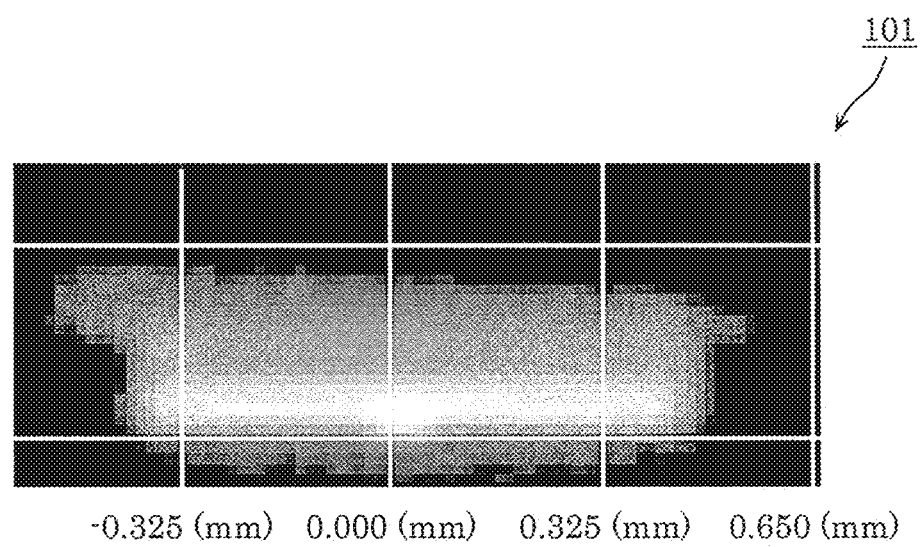
FIG. 13 is an image indicating the light emission intensity of the light emitting element.
Figure 13:
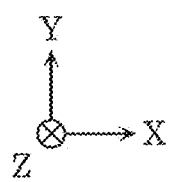
Figure 14:
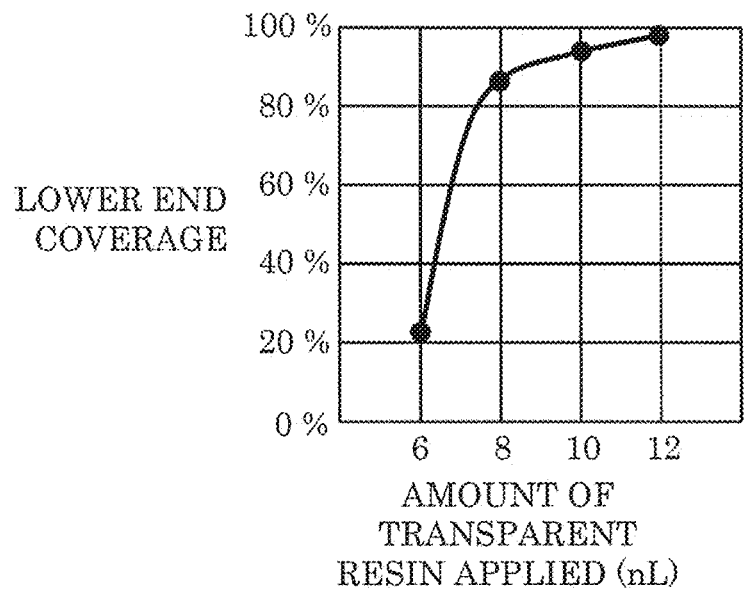
FIG. 14 is a graph showing a lower end coverage, relative to the amount of the transparent resin applied, at which the lower end of the light emitting element is covered.
Figure 15:
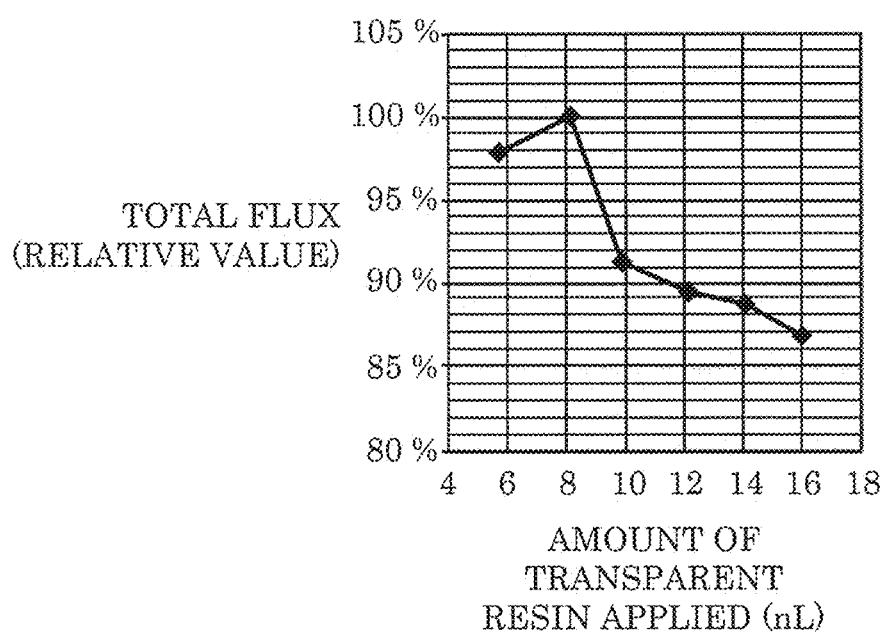
FIG. 15 is a graph showing relative values of the total flux of the light emitting element relative to the amount of the transparent resin applied.

With reference to FIG. 13 to FIG. 15, the following describes a covered region on a side surface of light emitting element 101 covered by transparent resin 108 in the light emitting device according to the present embodiments.

FIG. 13 shows the result of measuring the light emission intensity of light emitting element 101 in a side view before the side surfaces of light emitting element 101, transparent resin 108, and light transmissive member 107 are covered by reflective resin 201. FIG. 14 is a graph showing a relationship between the amount of transparent resin 108 applied on light emitting element 101 and the lower end coverage at which transparent resin 108 covers the lower end of a side surface of light emitting element 101 after the side surfaces of light emitting element 101, transparent resin 108, and light transmissive member 107 are covered by reflective resin 201. FIG. 15 is a graph showing a relationship between the amount of transparent resin 108 applied on light emitting surface 113 of light emitting element 101 and the total flux of light emitted from light emitting device 100. Note that FIG. 15 is a graph showing the value of the total flux relative to the amount of transparent resin 108 applied, letting the total flux is 100% when the amount of transparent resin 108 applied is 8nL. Note that the same amount of electricity is supplied to light emitting element 101 for all amounts of transparent resin 108 to be applied.

In light emitting element 101 illustrated in FIG. 13, the lower side (in the negative direction of the Y axis) of the drawing is semiconductor layer side 103 and the upper side (in the positive direction of the Y axis) of the drawing is growth substrate 102 side. It should be understood that, in FIG. 13, white portions excluding the auxiliary lines indicating the length are light emitting portions and that the light emission intensity of a whiter portion is higher. As illustrated in FIG. 13, in light emitting element 101, the light emission intensity at semiconductor layer 103 side is higher than the light emission intensity at growth substrate 102 side. In a side view, the light emission intensity of the side edge portions of semiconductor layer 103 in light emitting element 101 is lower than the light emission intensity of the central portion.

As illustrated in FIG. 14, the increase in the amount of transparent resin 108 applied raises the below-described lower end coverage at which the lower end of light emitting element 101 is covered. When 12nL of transparent resin 108 is applied, the lower end coverage of light emitting element 101 reaches 100%. The lower end coverage of light emitting element 101 of 100% indicates a state in which the lower end of a side surface of light emitting element 101 is fully covered by transparent resin 108 in a side view of light emitting element 101.

As illustrated in FIG. 15, the total flux increases with a gradual increase in the amount of transparent resin 108 applied. However, when the amount of transparent resin 108 applied exceeds 8nL, the total flux decreases.

As illustrated in FIG. 14 and FIG. 15, letting the total flux is 100% when the amount of transparent resin. 108 applied is 8nL, the total flux of about 95% or greater is achieved within an approximate range between GnL and 9nL, inclusive, of the amount of transparent resin 108 applied. In other words, the total flux of about 95% or greater is achieved within an approximate range between 20% and 90%, inclusive, of the lower end coverage at which the lower end is covered by transparent resin 108.

Here, the lower end coverage is defined as the following expression 1, where A is the length of the lower end of a side surface of light emitting element 101 in a side view, and B is the length of a region in such side surface to be covered by transparent resin 108:

(Lower end coverage)=$B/A$     Expression 1

From the above description, when the above-described lower end coverage is between 20% and 90%, inclusive, the total flux is greater than in the case where the lower end is fully covered (i.e., when the lower end coverage is 100%). Stated differently, when the lower end coverage is set between 20% and 90%, inclusive, an improved extraction efficiency of light emitted from light emitting element 101 is achieved, compared to the case where the lower end is fully covered.

As described above, when the lower end coverage is between 20% and 90%, inclusive, a periphery of transparent resin 108 is disposed so as to connect the lower end of covered portion 130 and a side edge of growth substrate 102 in a side view of light emitting element 101. More specifically, in a side view of light emitting element 101, a periphery of transparent resin 108 is disposed to incline from the lower end of a side surface of light emitting element 101 toward a side edge of growth substrate 102 so that the inclination extends toward the top surface of light emitting element 101. Stated differently, the periphery of transparent resin 108 is disposed so as to pass across between a region with a high light emission intensity and a region with a low light emission intensity on a side surface of semiconductor layer 103. This means that a light reflection surface (the interface between transparent resin 108 and reflective resin 201) is disposed at a location closer to a region with a high light emission intensity in a side surface of semiconductor layer 103, than in the case where the lower end is fully covered.

The above structure enables a part of light emitted from a region with a high light emission intensity in a side surface of semiconductor layer 103 to be guided to the outside of light emitting device 100 in a shorter distance than in the case where the side surface of light emitting element 101 is fully covered by transparent resin 108. In other words, a part of light emitted from a side surface of light emitting element 101 travels a shorter distance to pass through transparent resin 108 than in the case where the side surface of light emitting element 101 is fully covered by transparent resin 108. This reduces the loss in light attributable to transparent resin 108, and thus achieves an improved light extraction efficiency of light emitting device 100.

Note that the side surfaces of light emitting element 101 are not required to be fully covered by transparent resin 108 through to their lower end. More specifically, transparent resin 108 may be disposed to cover semiconductor layer 103 without fully covering the side surfaces of light emitting element 101 through to their lower end. Transparent resin 108 may also be disposed to cover active layer 105 without fully covering the side surfaces of light emitting element 101 through to their lower end.

In such cases too, transparent resin 108 is disposed on a side surface of semiconductor layer 103 such that covered portion 130 located at the central portion and an exposed portion located at a side edge are formed in a direction parallel to light emitting surface 113 of light emitting element 101. Furthermore, in a direction parallel to light emitting surface 113 of light emitting element 101, transparent resin 108 is disposed on a side surface of semiconductor layer 103 such that transparent resin 108 covers at least 20% in length of semiconductor layer 103 in a direction parallel to light emitting surface 113 of light emitting element 101.

With the above structure, a part of light emitted from a region with a high light emission intensity in a side surface of semiconductor layer 103 is guided to the outside of light emitting device 100 in a shorter distance than in the case where the side surface of light emitting element 101 is fully covered by transparent resin 108. In other words, a part of light emitted from a side surface of light emitting element 101 travels a shorter distance to pass through transparent resin 108 than in the case where the side surface of light emitting element 101 is fully covered by transparent resin 108. This reduces the loss in light attributable to transparent resin 108, and thus achieves an improved light extraction efficiency of light emitting device 100.

[4. Manufacturing Method]

The following describes an exemplary method of manufacturing light emitting device 100 and light emitting module 200 according to the present embodiments.

[4-1. Preparation for Submount~Mounting Process of Protection Element]

First, mounting substrate (submount) 203 is prepared, on a surface of which a conductive pattern has been formed. As mounting substrate 203, a substrate is used which is produced by forming, on an AIN substrate formed by firing, electrodes and a pattern of wiring 204 electrodes that have been formed in matrix through such a method as plating. Metal pads are formed on wiring 204 electrodes for connection with light emitting element 101. To encapsulate a multitude of LED chips (light emitting elements) 101 into a single package, necessary wiring patterns are previously designed to allow for serial connection or parallel connection in flip-chip bonding.

Note that in the case of mounting a protection element, for example, a protection element is ultrasonic-bonded onto mounting substrate 203 using a metal bump by flip-chip bonding. A protection element, which protects light emitting element 101 from overvoltage, is electrically connected to light emitting element 101. Example protection elements include a Zener diode (ZD), a diode, a varistor, a capacitor, and a resistive element.

[4-2. Mounting Process of Light Emitting Element]

The following describes a process of mounting light emitting element 101 onto mounting substrate 203. Examples of light emitting element 101 mounted onto mounting substrate 203 include a blue LED chip resulting from forming a nitride compound semiconductor on a GaN substrate. On light emitting element 101, metal bumps are formed on metal pads serving as electrodes having been formed. Light emitting element 101 is ultrasonic-bonded onto mounting substrate 203 through flip-chip bonding, with growth substrate 102 side surface up.

Here, light emitting element 101 includes growth substrate 102 and semiconductor layer 103, and an n-side electrode and a p-side electrode are formed on the same surface side of light emitting element 101 (e.g., on mounting surface 114 illustrated in FIG. 2). Growth substrate 102 serves as holding semiconductor layer 103. The surface of growth substrate 102 opposite to the surface on which semiconductor layer 103 is stacked serves a light emitting surface.

Note that small asperities may be formed on the back surface of growth. substrate 102 (i.e., light emitting surface 113, which is the top surface of light emitting element 101 having been mounted) through such processing as etching, blasting, lasering, and dicing blades. Light emitting surface 113 may be a rough surface of the micro-textured surfaces. This structure provides an improved light extraction efficiency of light from light emitting element 101. When growth substrate 102 is formed of a material such as sapphire having a lower refractive index than that of GaN, light emitting surface 113 may have a flat surface.

[4-3. Bonding Process of Light Transmissive Member]

The following describes a process of bonding light transmissive member 107 to light emitting element 101. First, a predetermined amount of silicone resin base transparent resin 108 is applied to a portion in the vicinity of the center of light emitting surface 113 of light emitting element 101 through a dispenser. Then, light transmissive member 107 in which phosphor (wavelength conversion member) has been dispersed is placed onto transparent resin 108, and then pressed from above so that transparent resin 108 covers the entirety of light emitting surface 113 of light emitting element 101. As a result, transparent resin 108 extends off bonding surface 110 of light transmissive member 107, to which transparent resin 108 is bonded, to cover the side surfaces of light emitting element 101. Because of surface tension, transparent resin 108 is formed to incline relative to the respective side surfaces of light emitting element 101. Then, transparent resin 108 is heated, for example, for three hours at a temperature of 150° C. in an oven to be cured. Note that the lower end coverage of light emitting element 101 can be changed by adjusting the amount and the position of transparent resin 108 to be dropped on light emitting surface 113 of light emitting element 101. Transparent resin 108 is applied, for example, by a dispensing method. The dispensing method allows for controlling the amount of transparent resin 108 to be applied by adjusting the amount of air supplied to a dispenser. The amount of transparent resin 108 to be applied may be controlled in accordance with a result of measuring the diameter of the bottom surface of transparent resin 108 having been disposed. After applied, transparent resin 108 forms an approximately hemispherical shape on light emitting element 101 in a side view.

With the dispensing method, transparent resin 108 discharged from a hollow nozzle spreads in a circle, and thus spreads concentrically when light transmissive member 107 is pressed from above. Since light emitting element 101 has an approximately square shape in a top view, the amount of transparent resin 108 extending off light emitting surface 113 of light emitting element 101 is greater in the central portion of a side surface of light emitting element 101 in a side view than in the edge portions, in a direction parallel to light emitting surface 113 of light emitting element 101. For this reason, transparent resin 108 covering a side surface of light emitting element 101 extends farther (more downward) at the central portion than at the edge portions on the side surface. As such, by adjusting the amount of transparent resin 108 to be applied, it is possible for transparent resin 108 to cover the central portion of a side surface of light emitting element 101 through to the lower end of the side surface of the light emitting element 101 in a direction parallel to light emitting surface 113 of light emitting element 101.

Also in the dispensing method, by adjusting the amount of transparent resin 108 to be applied, it is possible for light emitting element 101 to have exposed portions, on its side surface, at the corner portions at mounting surface 114 side of the light emitting element 101. The shapes of exposed portions 120 are approximately triangle in a side view, for example, as illustrated in FIG. 5. In a side view of transparent resin 108 having been disposed, the sides of transparent resin 108 opposite to light emitting element 101 are disposed to incline relative to the respective side surfaces of light emitting element 101.

Note that the shape of transparent resin 108 after bonded with light transmissive member 107 is controlled by adjusting the amount or the position of transparent resin 108 to be applied. For example, by applying a smaller amount of transparent resin 108 to those portions immediately above the corner portions, at mounting surface 114 side of light emitting element 101, at which exposed portions 120 are desired to be formed than the amount of transparent resin 108 to be applied to the other portions, the resulting shape of transparent resin 108 after bonded with light transmissive member 107 is a shape, as illustrated in FIG. 7 or FIG. 9, in which the corner portions at mounting surface 114 side of light emitting element 101 are exposed. Alternatively, at least one of the corner portions at mounting surface 114 side of light emitting element 101, for example, may be exposed.

Also note that the method of applying transparent resin 108 is not limited to the dispensing method, and thus a stamping method may be used. The stamping method allows for controlling the shape of transparent resin 108 to be discharged onto light emitting element 101 in accordance with the shape of a stamp pad. As such, the use of a stamp pad having, for example, a square shape or an X letter shape allows for controlling the amount of transparent resin 108 extending off the edges of light emitting element 101, when light transmissive member 107 is pressed from above to be bonded with light emitting element 101. In other words, the lower end coverage of light emitting element 101 is controllable.

[4-4. Formation Process of Dam Material]

The following describes a process of forming dam material 202. Light emitting module 200 is made by disposing dam material 202 to surround light emitting element 101, and then by injecting reflective resin 201 into the resulting circle formed by dam material 202. By covering the outer edge of light emitting element 101 with reflective resin 201, light emitted from the sides of light emitting element 101 or light transmissive member 107, for example, is reflected toward a light emission direction (upward) of light emitting module 200. Accordingly, an improved light extraction efficiency of light emitting module 200 is achieved. Furthermore, dam material 202 and reflective resin 201 are heated, for example, for about three hours at a temperature on the order of 150° C. in an oven to be cured. Light emitting module 200 is made through the above-described process.

[5. Effects etc.]

As described above, in the present embodiment, light emitting device 100 includes: light emitting element 101 including growth substrate 102 and semiconductor layer 103 located below growth substrate 102; and light transmissive member 107 disposed above a top surface of light emitting element 101. The light emitting device 100 further includes transparent resin 108 bonding the top surface of light emitting element 101 and a bottom surface of light transmissive member 107. The bottom surface of light transmissive member 107 encompasses the top surface of light emitting element 101. Transparent resin 108 continuously covers the bottom surface of light transmissive member 107 and a side surface of semiconductor layer 103. Here, transparent resin 108 is disposed to cover covered portion 130 of semiconductor layer 103 and to expose exposed portion 120 of semiconductor layer 103, covered portion 130 and exposed portion 120 being located at a central portion and a side edge portion, respectively, in a direction parallel to the top surface of light emitting element 101 in a side view. Transparent resin 108 covers covered portion 130 so that the side surface of semiconductor layer 103 is covered by at least 20% in length of semiconductor layer 103 in the direction parallel to the top surface of light emitting element 101 in a side view.

Stated differently, in a side view of light emitting element 101, a periphery of transparent resin 108 is disposed on a side surface of light emitting element 101 so as to pass across between a region with a high light emission intensity at the central portion of semiconductor layer 103 and a region with a low light emission intensity at a side edge of semiconductor layer 103. Accordingly, a part of light emitted from the region with a high light emission intensity is guided to the outside of light emitting device 100 in a shorter distance than in the case where the side surface of light emitting element 101 is fully covered by transparent resin 108. In other words, a part of light emitted from the side surface of light emitting element 101 travels a shorter distance to pass through transparent resin 108. This reduces the loss in light attributable to transparent resin 108, and thus achieves an improved light extraction efficiency of light emitting device 100.

Moreover, in a side view of light emitting element 101, a periphery of transparent resin 108 may connect a lower end of covered portion 130 and a side edge portion of growth substrate 102, and may further extend toward the bottom surface of light transmissive member 107, in an inclined state relative to a side surface of light emitting element 101.

Stated differently, in a side view of light emitting element 101, a periphery of transparent resin 108 is disposed on a side surface of light emitting element 101 so as to diagonally pass across between a region with a high light emission intensity in semiconductor layer 103 and a region with a low light emission intensity in semiconductor layer 103 from the lower end toward a side edge of light emitting element 101. Accordingly, a part of light emitted from the region with a high light emission intensity is guided to the outside of light emitting device 100 in a shorter distance than in the case where the side surface of light emitting element 101 is fully covered by transparent resin 108. In other words, a part of light emitted from the side surface of light emitting element 101 travels a shorter distance to pass through transparent resin 108. This reduces the loss in light attributable to transparent resin 108, and thus achieves an improved light extraction efficiency of light emitting device 100.

Moreover, the sides of transparent resin 108 opposite to light emitting element 101 are formed to incline relative to the respective side surfaces of light emitting element 101.

Stated differently, transparent resin 108 forms inclined surfaces 111 that are inclined relative to the respective side surfaces of light emitting element 101. Accordingly, the light extraction efficiency of light emitting device 100 is improved.

Moreover, in a side view of light emitting element 101, transparent resin 108 may cover covered portion 130 so that a lower end of semiconductor layer 103 is covered by at least 20% in length of semiconductor layer 103 in the direction parallel to the top surface of light emitting element 101.

Stated differently, the lower end coverage at which covered portion 130 formed at a side surface of light emitting element 101 is covered may be 20% or greater. Accordingly, the light extraction efficiency of light emitting device 100 is improved.

Moreover, in a side view of light emitting element 101, transparent resin 108 may cover covered portion 130 so that a lower end of semiconductor layer 103 is covered by 90% or less in length of semiconductor layer 103 in the direction parallel to the top surface of light emitting element 101.

Stated differently, the lower end coverage at which covered portion 130 formed at a side surface of light emitting element 101 is covered may be 90% or less. Accordingly, the light extraction efficiency of light emitting device 100 is improved.

Moreover, in a side view of light, emitting element 101, exposed portion 120 may be located at both edge portions of semiconductor layer 103 in the direction parallel to the top surface of light emitting element 101. Stated differently, in a side view of light emitting element 101, a periphery of transparent resin 108 is disposed on a side surface of light. emitting element 101 so as to pass across between a region with a high light emission intensity at the central portion of semiconductor layer 103 and a region with a low light emission intensity at a side edge of semiconductor layer 103. Accordingly, a part of light emitted from the region with a high light emission intensity is guided to the outside of light emitting device 100 in a shorter distance than in the case where the side surface of light emitting element 101 is fully covered by transparent resin 108. In other words, a part of light emitted from the side surface of light emitting element 101 travels a shorter distance to pass through transparent resin 108. This reduces the loss in light attributable to transparent resin 108, and thus achieves an improved light extraction efficiency of light emitting device 100.

Moreover, in a side view of light emitting element 101, exposed portion 121 may be located only at one edge portion of semiconductor layer 103 in the direction parallel to the top surface of light emitting element 101.

Stated differently, in a side view of light emitting element 101, a periphery of transparent resin 108 is disposed on a side surface of light emitting element 101 so as to pass across between a region with a high light emission intensity at the central portion of semiconductor layer 103 and a region with a low light emission intensity at a side edge of semiconductor layer 103. Accordingly, a part of light emitted from the region with a high light emission intensity is guided to the outside of light emitting device 100 in a shorter distance than in the case where the side surface of light emitting element 101 is fully covered by transparent resin 108. In other words, a part of light emitted from the side surface of light emitting element 101 travels a shorter distance to pass through transparent resin 108. This reduces the loss in light attributable to transparent resin 108, and thus achieves an improved light extraction efficiency of light emitting device 100a.

Moreover, light transmissive member 107 may be a plate-shaped wavelength conversion member that converts a wavelength of light from light emitting element 101.

Stated differently, light transmissive member 107 includes a wavelength conversion member for converting a part of light from light emitting element 101. Accordingly, when a blue LED is used as light emitting element 101, for example, it is possible to produce light emitting device 100 capable of emitting desired white light, by adjusting at least one of the type of a wave conversion member and the amount of such wavelength conversion member. Moreover, with light transmissive member 107 having a plate shape, it is possible to dispose transparent resin 108 such that transparent resin 108 more evenly covers light emitting element 101 when light emitting element 101 and light transmissive member 107 are bonded via transparent resin 108.

Moreover, growth substrate 102 may be a GaN substrate.

Stated differently, a GaN substrate, for example, is used as growth substrate 102. Accordingly, since light emitting element 101 produced by use of a GaN substrate has an improved light emission efficiency, is possible to produce light emitting device 100 with an improved light emission efficiency.

Moreover, transparent resin 108 may be a silicone resin,

Stated differently, a silicone resin with high transmissivity to blue light, for example, is used as transparent resin 108. Accordingly, light emitting device 100 produced by use of a silicone resin provides an improved light extraction efficiency.

Also, light emitting module 200 according to the present embodiments includes: light emitting device 100 or 100a; mounting substrate 203 onto which light emitting device 100 or 100a is mounted; reflective resin 201 disposed to cover a side surface of light emitting device 100 or 100.

Stated differently, light emitting module 200 can include light emitting device 100 or light emitting device 100a with an improved light extraction efficiency. Accordingly, the light extraction efficiency of light emitting module 200 is improved.

The light emitting element according to one or more aspects of the present disclosure has been described on the basis of exemplary embodiments, but the present disclosure is not limited to such embodiments. Therefore, such one or more aspects of the present disclosure may include, without departing from the essence of the present disclosure, a variation achieved by making various modifications to the present disclosure that can be conceived by those skilled in the art or an embodiment achieved by combining structural components in different embodiments.

Also note that the above embodiments describe the light emitting module using a single light emitting device, but the present disclosure is not limited to this. The light emitting module of the present disclosure may include a plurality of light emitting devices according to the above embodiments. Also, the shape of the transparent resin of the present embodiments may be formed by bonding a single light transmissive member on a plurality of light emitting elements.

Also, the light emitting element according to the present embodiments includes a plurality of n-electrode bumps and a plurality of p-electrode bumps, but the present disclosure is not limited to the described number and disposition of such electrode bumps formed on the light emitting element. For example, a single n-electrode bump and a single p-electrode bump may be formed on the light emitting element so that such electrode bumps are disposed at one pair of opposing corners of the mounting surface of the light emitting element in a top view.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The light emitting device and the light emitting module according to the present disclosure are useful as a light source for lighting or as a backlight light source for devices such as liquid crystal device.

What is claimed is:

1. A light emitting device, comprising:
a light emitting element including a substrate and a semiconductor layer located below the substrate;
a light transmissive member disposed above a top surface of the light emitting element; and
a transparent resin bonding the top surface of the light emitting element and a bottom surface of the light transmissive member,
wherein the bottom surface of the light transmissive member encompasses the top surface of the light emitting element,
the transparent resin continuously covers the bottom surface of the light transmissive member and a side surface of the semiconductor layer,
the transparent resin is disposed to cover a covered portion of a side surface of the semiconductor layer and a part of a side surface of the substrate, and to expose an exposed portion of the side surface of the semiconductor layer and a part of the side surface of the substrate, the covered portion and the exposed portion being located at a central portion and a side edge portion, respectively, in a direction parallel to the top surface of the light emitting element, the side surface of the semiconductor layer and the side surface of the substrate both on a same side of the light emitting device,
the transparent resin covers the covered portion so that the side surface of the semiconductor layer is covered by at least 20% in length of the semiconductor layer in the direction, and
a periphery of the transparent resin connects the covered portion and a side edge portion of the substrate, and further extends toward the bottom surface of the light transmissive member located at a side of the light emitting element, in an inclined state relative to a side surface of the light emitting element.

2. The light emitting device according to claim 1, wherein in a side view of the light emitting element, the periphery of the transparent resin connects a lower end of the semiconductor layer and the side edge portion of the substrate.

3. The light emitting device according to claim 1, wherein in a side view of the light emitting element, the transparent resin covers the covered portion so that a lower end of the semiconductor layer is covered by at least 20% in length of the semiconductor layer in the direction.

4. The light emitting device according to claim 1, wherein in a side view of the light emitting element, the transparent resin covers the covered portion so that a lower end of the semiconductor layer is covered by 90% or less in length of the semiconductor layer in the direction.

5. The light emitting device according to claim 1, wherein in a side view of the light emitting element, the exposed portion is located at both edge portions of the semiconductor layer in the direction.

6. The light emitting device according to claim 1, wherein in a side view of the light emitting element, the exposed portion is located only at one edge portion of the semiconductor layer in the direction.

7. The light emitting device according to claim 1, wherein the light transmissive member is a plate-shaped wavelength conversion member that converts a wavelength of light from the light emitting element.

8. The light emitting device according to claim 1, wherein the substrate is a GaN substrate.

9. The light emitting device according to claim 1, wherein the transparent resin is a silicone resin.

10. The light emitting device according to claim 1, wherein the semiconductor layer includes an n-type semiconductor layer, an active layer, and a p-type semiconductor layer in stated order from the substrate side, and an n-electrode is disposed on the n-type semiconductor layer at a corner portion where the exposed portion is disposed.

11. The light emitting device according to claim 1, wherein the transparent resin entirely covers the bottom surface of the light transmissive member.

12. A light emitting module comprising:
the light emitting device according to claim 1;
a mounting substrate onto which the light emitting device is mounted; and
a reflective resin disposed to cover a side surface of the light emitting device.

13. The light emitting module according to claim 12, wherein the light emitting device is bump-bonded onto the mounting substrate.

14. The light emitting module according to claim 12, wherein a dam material is disposed around the reflective resin.

* * * * *